(12) United States Patent
Kuroi et al.

(10) Patent No.: US 6,841,440 B2
(45) Date of Patent: Jan. 11, 2005

(54) SEMICONDUCTOR DEVICE INCLUDING IMPURITY LAYER HAVING CONTINUOUS PORTIONS FORMED AT DIFFERENT DEPTHS AND METHOD OF MANUFACTURING THE SAME

(75) Inventors: Takashi Kuroi, Chiyoda-ku (JP); Syuichi Ueno, Chiyoda-ku (JP); Katsuyuki Horita, Chiyoda-ku (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/352,097

(22) Filed: Jan. 28, 2003

(65) Prior Publication Data

US 2003/0143810 A1 Jul. 31, 2003

Related U.S. Application Data

(62) Division of application No. 09/805,923, filed on Mar. 15, 2001, now Pat. No. 6,541,825.

(30) Foreign Application Priority Data

Oct. 4, 2000 (JP) ........................................ 2000-304372

(51) Int. Cl.[7] .......................................... H01L 21/8238
(52) U.S. Cl. ........................ 438/218; 438/248; 438/424; 438/433
(58) Field of Search ................................ 438/218, 248, 438/294, 424, 433, 435, 437, 700

(56) References Cited

U.S. PATENT DOCUMENTS

| 5,889,335 | A | | 3/1999 | Kuroi et al. |
|---|---|---|---|---|
| 6,127,737 | A | | 10/2000 | Kuroi et al. |
| 6,261,920 | B1 | * | 7/2001 | Oyamatsu ..................... 438/424 |
| 6,277,710 | B1 | * | 8/2001 | Kim et al. ................... 438/431 |
| 6,287,920 | B1 | | 9/2001 | Chatterjee et al. |
| 6,335,234 | B2 | | 1/2002 | Wu et al. |
| 6,362,511 | B1 | | 3/2002 | Mizushima et al. |
| 6,541,825 | B2 | * | 4/2003 | Kuroi et al. ................. 257/376 |

FOREIGN PATENT DOCUMENTS

| JP | 61-99376 | 5/1986 |
|---|---|---|
| JP | 10-189951 | 7/1998 |

OTHER PUBLICATIONS

Wolf and Tauber; "Silicon Processing for the VLSI Era vol. 1: Process Technology"; p. 298; copyright 1986, Lattice Press; Sunset Beach, CA.*

* cited by examiner

Primary Examiner—George Fourson
Assistant Examiner—Fernando L. Toledo
(74) Attorney, Agent, or Firm—Oblon, Spivak, McClelland, Maier & Neustadt, P.C.

(57) ABSTRACT

A trench is formed in a substrate and a silicon oxide film which serves as a trench isolation is buried in the trench. The silicon oxide film has no shape sagging from a main surface of the substrate. A channel impurity layer to control a threshold voltage of a MOSFET is formed in the main surface of the substrate. The channel impurity layer is made of P-type layer, having an impurity concentration higher than that of the substrate. A first portion of the channel impurity layer is formed near an opening edge of the trench along a side surface of the trench in the source/drain layer, and more specifically, in the N[+]-type layer. A second portion of the channel impurity layer is formed deeper than the first portion. A gate insulating film and a gate electrode are formed on the main surface of the substrate.

8 Claims, 17 Drawing Sheets

SEMICONDUCTOR DEVICE INCLUDING IMPURITY LAYER HAVING CONTINUOUS PORTIONS FORMED AT DIFFERENT DEPTHS AND METHOD OF MANUFACTURING THE SAME

CROSS-REFERENCE TO RELATED APPLICATION

The present application is a division of application Ser. No. 09/805,923 filed on Mar. 15, 2001 now U.S. Pat. No. 6,541,825. The present application claims priority under 35 U.S.C. §119 to Japanese Patent Application No. 200-304372, filed Oct. 4, 2000, and under 35 U.S.C. § 120 to co-pending U.S. patent application Ser. No. 09/805,923 filed Mar. 15, 2001, the entire contents of which are incorporated herein by reference.

BACKGROUND OF THE INVENTION

1. Field of the Invention

The present invention relates to a semiconductor device having a trench-type isolation structure and a method of manufacturing the same.

2. Description of the Background Art

In a semiconductor integrated circuit, in order to completely independently control elements in its operation, it is necessary to eliminate electrical interference between the elements. For this reason, an isolation structure having an isolation region is adopted in the semiconductor integrated circuit. As one of the isolation structures, a trench isolation method is widely known and various improvements thereof are proposed.

The trench isolation method is a method to electrically insulate the elements by forming a trench which extends from a surface of a substrate towards the inside thereof and filling the inside of the trench with a dielectric substance. In this method, there is little bird's beak, which is found in the isolation structure formed by the LOCOS method. For this reason, the isolation structure by the trench isolation method needs a smaller area on the surface of the substrate to form than that by the LOCOS method, and therefore the trench isolation method is a preferable method to promote size reduction of the semiconductor integrated circuit. Accordingly, the trench isolation method is an essential isolation method in the semiconductor integrated circuit whose size is to be further reduced in the future.

FIG. 23 is a schematic plan (top) view showing a semiconductor device 101P in the background art. FIGS. 24 and 25 are (vertical) cross sections taken along the line AP—AP and the line BP—BP in FIG. 23, respectively. FIG. 26 is an enlarged cross section showing part of FIG. 25. In FIG. 23, part of the elements shown in FIGS. 24 to 26 are omitted.

As shown in FIGS. 23 to 26, the semiconductor device 101P comprises a P-type silicon single crystal substrate (hereinafter, referred to simply as "substrate") 1P. A trench 2P is formed, extending from a main surface 1SP of the substrate 1P towards the inside of the substrate 1P, and the trench 2P forms an isolation region AR2P.

A silicon oxide film 9AP is formed on an inner surface 2SP of the trench 2P and a silicon oxide film 9BP is formed on the silicon oxide film 9AP. In this case, the inside of the trench 2P is filled with the silicon oxide films 9AP and 9BP (also generally referred to as "silicon oxide film 9P"). The silicon oxide film 9P is a so-called trench isolation.

In the background-art semiconductor device 101P, the silicon oxide film 9P which serves as the trench isolation has a shape sagging from the main surface 1SP of the substrate 1P along an opening edge of the trench 2P (hereinafter, also referred to as "sag or depression") 9RP.

An N channel-type field effect transistor (NMOSFET) is formed in an active region AR1P of the semiconductor device 101P. In more detail, a gate insulating film 4P extends on the main surface 1SP of the substrate 1P across the active region AR1P (see FIG. 23). A polysilicon film 5AP and a tungsten silicide film 5BP are layered on the gate insulating film 4P in this order, and the polysilicon film 5AP and the tungsten silicide film 5BP form a gate electrode 5P. Further, as shown in FIGS. 25 and 26, the gate electrode 5P extends also on the silicon oxide film 9P across the silicon oxide film 9P and is also arranged in the sag 9RP of the silicon oxide film 9P. A sidewall oxide film 41P is formed on the gate insulating film 4P, being in contact with a side surface of the gate electrode 5P.

Further, two source/drain layers 6P are formed in the main surface 1SP of the substrate 1P with a channel region of the MOSFET below the gate electrode 5P interposed therebetween. The source/drain layers 6P consists of an $N^+$-type layer 6BP and an $N^-$-type layer 6AP, and the $N^-$-type layer 6AP has an impurity concentration lower than that of the $N^+$-type layer 6BP and is formed closer to the channel region.

Furthermore, a channel impurity layer 10P to control a threshold voltage of the MOSFET is formed in the main surface 1SP of the substrate 1P. The channel impurity layer 10P is formed of a P-type layer like the substrate 1P and has an impurity concentration higher than that of the substrate 1P. The channel impurity layer 10P is provided in a region deeper than the channel region and the whole of it is formed in a plane substantially parallel to the main surface 1SP of the substrate 1P. Part of the channel impurity layer 10P and part of the source/drain layers 6P share a formation region (overlap one another) in the substrate 1P, and more specifically, the channel impurity layer 10P is formed across bottom portions of the source/drain layers 6P.

Next, a method of manufacturing the semiconductor device 101P will be discussed, referring to FIGS. 27 to 31 along with FIGS. 23 to 26. Further, FIGS. 27 to 31 are vertical cross sections taken along the line AP—AP of FIG. 23, like FIG. 24.

First, the substrate 1P is prepared, and the main surface 1SP of the substrate 1P is thermally oxidized to form a silicon oxide film 7P (see FIG. 27). Subsequently, a silicon nitride film 8P (see FIG. 27) is formed on the silicon oxide film 7P.

Next, a resist (not shown) to cover a region other than the region which is to be the isolation region is formed on the silicon nitride film 8P by photolithography technique. Then, by anisotropic etching with the resist used as a mask, the silicon nitride film 8P, the silicon oxide film 7P and the sub 1P is partially etched in this order. With this etching, a trench 2aP is formed, extending from an exposed surface of the silicon nitride film 8P to the inside of the substrate 1P as shown in FIG. 27. After that, the inner surface 2SP of the trench 2aP is thermally oxidized to form a silicon oxide film 9AaP as shown in FIG. 28, and subsequently a silicon oxide film 9BaF is so deposited as to cover the whole surface of the substrate 1P on the side of the main surface 1SP to fill the inside of the trench 2aP by the HDP (High Density Plasma)-CVD (Chemical Vapor Deposition) method.

The silicon oxide film 9BaP is polished until the silicon nitride film 8P is exposed by the CMP (Chemical Mechanical Polishing) method with the silicon nitride film 8P used as a stopper (see FIG. 29). With this polishing, the portion of the silicon oxide film 9BaP existing in the trench 2aP remains as the silicon oxide film 9BbP.

Then, the silicon nitride film 8P is removed with thermal phosphoric acid and subsequently the silicon oxide film 7P is removed with hydrofluoric acid (see FIG. 30). With these removing processes, the trench 2P which is part of the trench 2aP existing in the substrate 1P remains. Further, as shown in FIG. 30, in the process using the hydrofluoric acid, the sag 9RP is formed in the silicon oxide films 9AaP and 9BbP along an opening edge of the trench 2P.

Next, the main surface 1SP of the substrate 1P is thermally oxidized to form a silicon oxide film again. Then, the channel impurity layer 10P is formed by ion implantation as shown in FIG. 31. Subsequently, the silicon oxide film is removed with the hydrofluoric acid. At this time, the silicon oxide films 9AaP and 9BbP is partially etched to form the silicon oxide film 9P consisting of the silicon oxide films 9AP and 9BP, but the sag 9RP is formed or enlarged in this process using the hydrofluoric acid.

After that, the silicon oxide film, the polysilicon film and the tungsten silicide film are sequentially formed and patterned to form the gate insulating film 4P and the gate electrode 5P (see FIGS. 24 and 25). The ion implantation to form the N⁻-type layer 6AP, formation of the sidewall oxide film 41P and the ion implantation to form the N⁺-type layer 6BP are sequentially performed to complete the semiconductor device 101P shown in FIGS. 23 to 25.

As discussed above, the semiconductor device 101P has the sag 9RP in the opening edge of the silicon oxide film 9P serving as the trench isolation. Specifically, in the background-art method of manufacturing the semiconductor device 101P, the silicon oxide films 9AaP and 9BbP is also partially etched and the sag 9RP is formed in the silicon oxide film 9P when the silicon oxide film 7P and the silicon oxide film which is formed again after removing the silicon oxide film 7P are removed with hydrofluoric acid (see FIGS. 29 to 31).

As shown in FIG. 26, since the sag 9RP is formed lower than the main surface 1SP of the substrate 1P, a portion of the gate electrode 5P which is formed in the sag 9RP is closer to the side surface of the trench 2P as compared with a case where no sag 9RP is formed. For this reason, an electric field E on the side surface of the trench 2P or the active region AR1P among the electric field caused by a voltage applied to the gate electrode 5 becomes strong. In other words, the electric field E is concentrated on an edge of the active region.

Since such an electric field concentration deteriorates the potential at the edge of the active region, the threshold voltage at the edge of the active region of the MOSFET is lower than that in the channel region (central portion). Specifically, a parasitic MOSFET (or parasitic element) having a threshold voltage lower than a desired (designed) voltage is formed at the edge of the active region. For this reason, the parasitic MOSFET turns on first in the operation, and then portions other than the parasitic MOSFET turn on. As a result, as indicated by the characteristic line β in the view of FIG. 32 showing the characteristics of the MOSFET, a drain current of the MOSFET starts to flow at a voltage lower the desired threshold voltage. In other words, a hump is observed in the characteristic view.

Further, when the channel width decreases as the size of the device is reduced, the presence of the parasitic MOSFET causes an inverse-narrow channel effect where the threshold voltage decreases as the channel width decreases. In other words, a current starts to flow at a voltage lower than the desired threshold voltage in the MOSFET due to the inverse-narrow channel effect.

Furthermore, even in a case of no sag 9RP, the electric field from various wires and the like formed in the isolation region AR2P or on the silicon oxide film 9P affects the potential at the edge of the active region through the silicon oxide film 9P or through the side surface of the trench 2P, to possibly form the parasitic MOSFET.

Since the hump and the inverse-narrow channel effect due to the presence of the parasitic MOSFET causes an increase in off current or leak current of the MOSFET, the yield of the semiconductor device 101P is disadvantageously lowered.

Further, though no sag is formed in the LOCOS because of difference in the method of forming the isolation structure, the trench isolation structure is essential for further size reduction of the semiconductor device, as discussed earlier.

SUMMARY OF THE INVENTION

The present invention is directed to a semiconductor device. According to a first aspect of the present invention, the semiconductor device comprises: a substrate having a main surface and including a semiconductor material of a predetermined conductivity type which has a predetermined impurity concentration; a trench formed extending from the main surface of the substrate towards the inside of the substrate; a dielectric substance formed in the trench, serving as a trench isolation; a first impurity layer having the same conductivity type as the predetermined conductivity type of the substrate and an impurity concentration higher than the predetermined impurity concentration of the substrate and extending in the substrate, being opposed to the main surface of the substrate; and a second impurity layer having a conductivity type opposite to the predetermined conductivity type of the substrate, formed in a portion inside the main surface of the substrate, and in the semiconductor device of the first aspect, the first impurity layer includes a first portion; and a second portion continuous with the first portion, extending deeper than the first portion from the main surface of the substrate, and part of the first portion of the first impurity layer is formed in the second impurity layer.

According to a second aspect of the present invention, in the semiconductor device of the first aspect, the first portion of the first impurity layer is provided along a side surface of the trench.

According to a third aspect of the present invention, in the semiconductor device of the first or second aspect, the first portion of the first impurity layer is provided near an opening edge of the trench in the substrate.

According to a fourth aspect of the present invention, the semiconductor device of any one of the first to third aspects further comprises: a third impurity layer having the same conductivity type as the second impurity layer has, formed in another portion inside the main surface of the substrate without being in contact with the second impurity layer, and in the semiconductor device of the fourth aspect, another part of the first portion of the first impurity layer which is different from the part is formed in the third impurity layer, and the semiconductor device of the fourth aspect further comprises: a field effect transistor including the second impurity layer and the third impurity layer as source/drain layers, respectively.

According to a fifth aspect of the present invention, in the semiconductor device of the fourth aspect, the field effect transistor includes a gate insulating film formed on the main surface of the substrate; and a gate electrode extending over the gate insulating film and the dielectric substance.

The present invention is also directed to a method of manufacturing a semiconductor device. According to a sixth aspect of the present invention, the method of manufacturing a semiconductor device comprises the steps of: (a) preparing a substrate including a predetermined semiconductor material and having a predetermined conductivity type; (b) forming an oxide film including an oxide of the predetermined semiconductor material on the substrate to have a predetermined film thickness; (c) forming a semiconductor film including the predetermined semiconductor material on the oxide film; (d) partially etching the semiconductor film, the oxide film and the substrate in this order to form a trench which extends from the semiconductor film towards the inside of the substrate; (e) oxidizing surfaces of the substrate and the semiconductor film which are exposed in the trench to make an edge portion of the oxide film along the trench thicker than the predetermined film thickness; and (f) implanting an impurity of the same conductivity type as the predetermined conductivity type into the substrate through the oxide film after the step (e).

According to a seventh aspect of the present invention, in the method of the sixth aspect, the impurity implanted in the step (f) has a distribution in a direction of depth of the substrate with its peak near an interface between the edge portion which becomes thicker in the step (e) and the substrate.

According to an eighth aspect of the present invention, the method of the sixth or seventh aspect further comprises the step of: (g) performing a rapid thermal annealing on the substrate after the step (f).

According to a ninth aspect of the present invention, the method of any one of the sixth to eighth aspects further comprises the step of: (h) removing the semiconductor film by isotropic etching.

In the semiconductor device of the first aspect of the present invention, in a portion of the second impurity layer where part of the first portion of the first impurity layer is arranged, the impurity concentration of the second impurity layer can be lowered. Therefore, a depletion layer formed in a junction face between the second impurity layer and the substrate is likely to be widened near this portion, the junction capacitance can be reduced. Since this reduces the junction capacitance in the whole junction face, it is possible to improve an operating speed which is low due to large junction capacitance.

In the semiconductor device of the second aspect of the present invention, the first portion of the first impurity layer is provided along the side surface of the trench. Considering that the electric field from wires and the like arranged on the dielectric substance in the trench affects a potential of the substrate from the side surface of the trench, the first portion can compensate the characteristic feature near the trench. This reduces the problems in operation of the semiconductor device due to the electric field.

In the semiconductor device of the third aspect of the present invention, the first portion of the first impurity layer is provided near the opening edge of the trench. Anyway, the above electric field from the wires on the dielectric substance becomes stronger as it is closer to the wires and the like, in other words, closer to the opening edge of the trench. In this case, since the first portion of the first impurity layer is provided in a portion where the above electric field is stronger, it is possible to reliably reduce the problems in operation due to the above electric field.

In the semiconductor device of the fourth aspect of the present invention, since the second impurity layer and the third impurity layer (equivalent to the second impurity layer) serve as the source/drain layers of the field effect transistor, the operation of the field effect transistor, accordingly, the operation of the semiconductor device can be made faster.

In the semiconductor device of the fifth aspect of the present invention, it is possible to reduce the leak current by suppressing the hump and the inverse-narrow channel effect in the field effect transistor. As a result, the field effect transistor, accordingly, the semiconductor device can operate with desired (designed) characteristics. Further, in a case of DRAM (Dynamic Random Access Memory) including the field effect transistor, it is possible to suppress the loss of electric charges accumulated in a capacitor of the DRAM through the above reduction in leak current.

In the method of the sixth aspect of the present invention, in the oxidation step (e), the edge portion of the oxide film is made thicker than the initial state (in the step (b)). Therefore, even if the substrate is exposed by wet-etching the oxide film in the later step, with the thicker portion (edge portion) of the oxide film, it is possible to avoid formation of sag near the opening edge of the trench. Accordingly, it is possible to suppress formation of parasitic elements due to the presence of the sag and reduce the problems in operation of the semiconductor device.

Further, the impurity can be implanted shallower through the thicker portion (edge portion) of the oxide film than through a portion having an initial film thickness. Therefore, since the impurity can be implanted closer to the main surface of the substrate (the surface in contact with the oxide film) through the thicker portion than the portion having the initial film thickness near the trench, it is possible to increase the impurity concentration near the trench as compared with the initial impurity concentration of the substrate. The characteristic feature near the trench can be compensated with this high-concentration region and this can reduce the problems in operation of the semiconductor device due to the electric field from wires and the like arranged on the dielectric substance in the trench.

Moreover, in the step (f), the depth of impurity implantation can be easily controlled by implanting the impurity through the oxide film after the step (e). In other words, it is not necessary to implant the impurity in different steps with resists formed in order to change the implantation depth.

As the result of these effects, it is possible to manufacture the semiconductor device which can operate with desired characteristics at good yield.

In the method of the seventh aspect of the present invention, the concentration of the impurity in the substrate can become higher near the opening edge. Therefore, it is possible to reliably reduce the problems in operation due to the above electric field.

In the method of the eighth aspect of the present invention, it is possible to anneal out the point defect in the crystal caused by implantation of the impurity. Further, it is possible to suppress TED (Transient Enhanced Diffusion) in the later heat treatment and therefore the impurity can have a desired distribution. Accordingly, it is possible to reliably manufacture the semiconductor device which can exert the same effects as the methods of the sixth and seventh aspects.

In the method of the ninth aspect of the present invention, it is possible to avoid the damage at the anisotropic etching. Further, the whole of the semiconductor film can be easily removed with etching remainders reduced.

An object of the present invention is to provide a semiconductor device capable of operating with desired characteristics with formation of parasitic element in an active region suppressed, and a method of manufacturing the same.

These and other objects, features, aspects and advantages of the present invention will become more apparent from the following detailed description of the present invention when taken in conjunction with the accompanying drawings.

DESCRIPTION OF THE PREFERRED EMBODIMENTS

<The First Preferred Embodiment>

Figure 1:
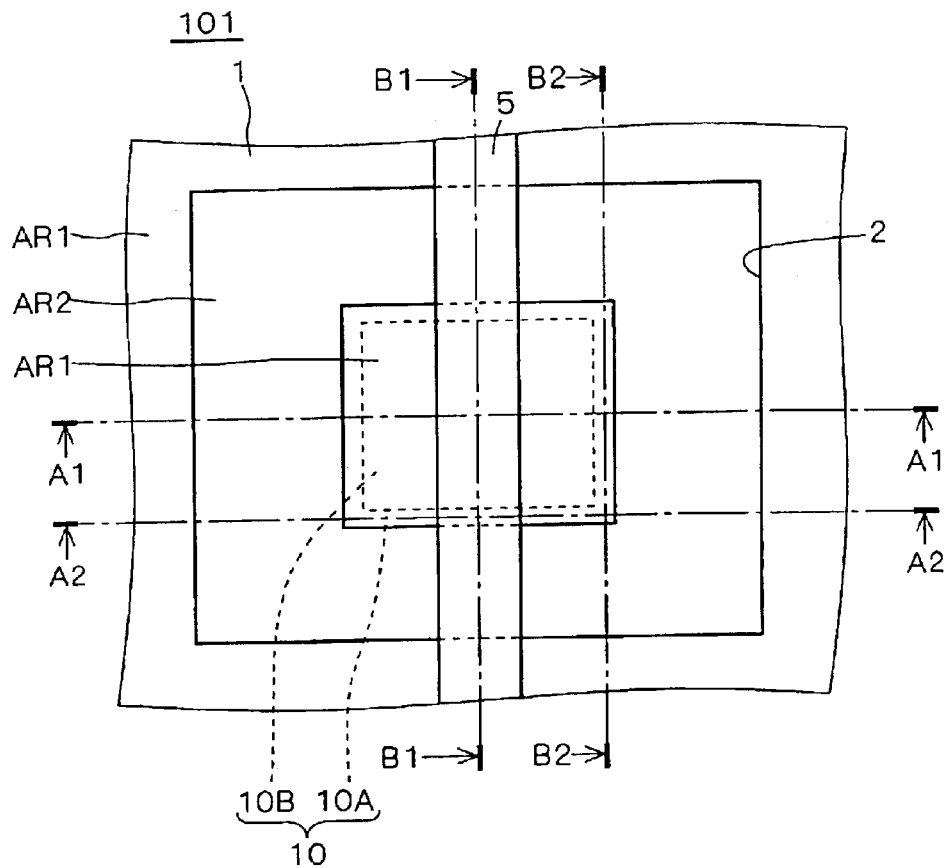
FIG. 1 is a schematic plan view showing a semiconductor device in accordance with a first preferred embodiment of the present invention.
Figure 2:
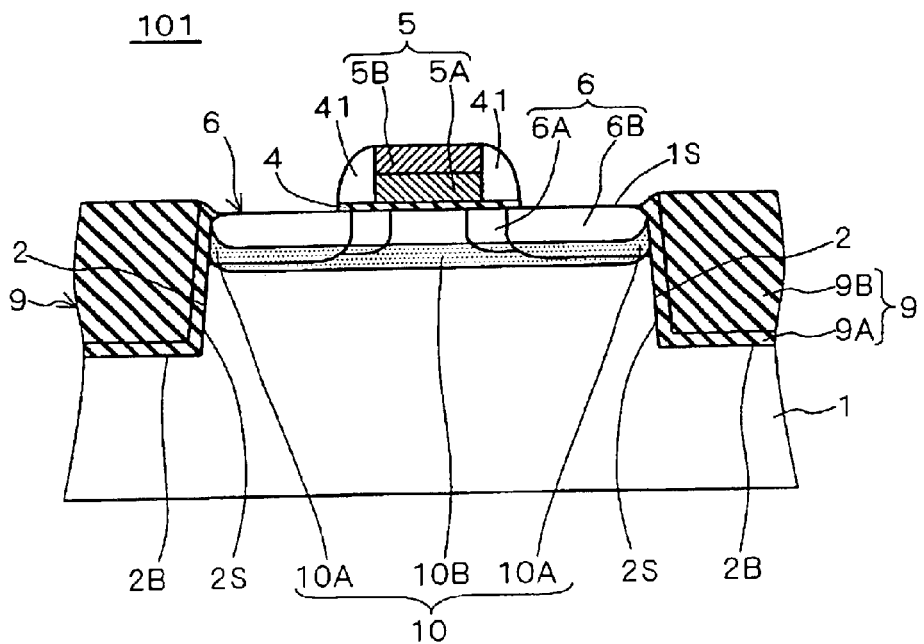
FIG. 2 is a cross section showing the semiconductor device in accordance with the first preferred embodiment of the present invention.
Figure 3:
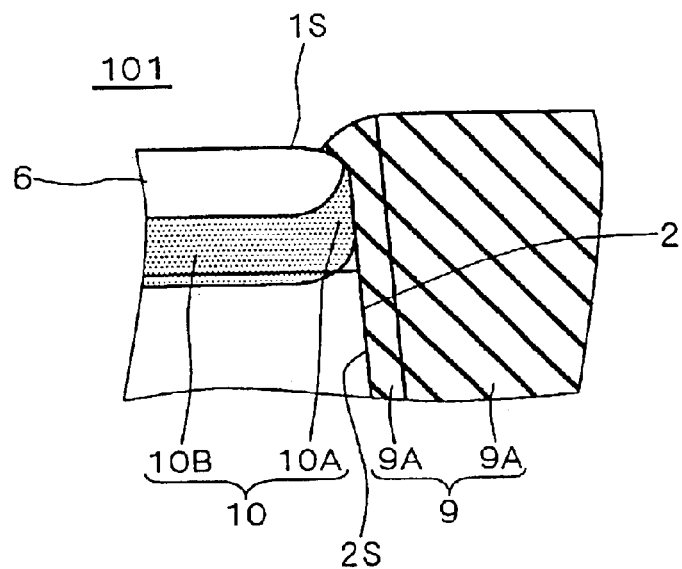
FIG. 3 is a cross section showing part of the semiconductor device in accordance with the first preferred embodiment of the present invention.
Figure 4:
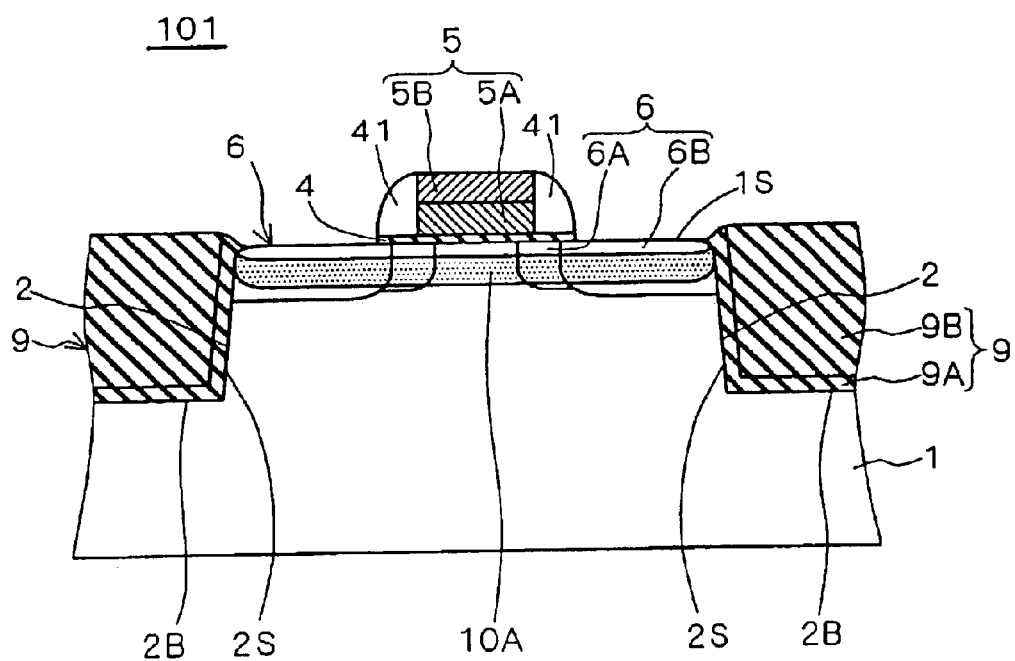
FIGS. 4 and 5 are cross sections each showing the semiconductor device in accordance with the first preferred embodiment of the present invention.
Figure 5:
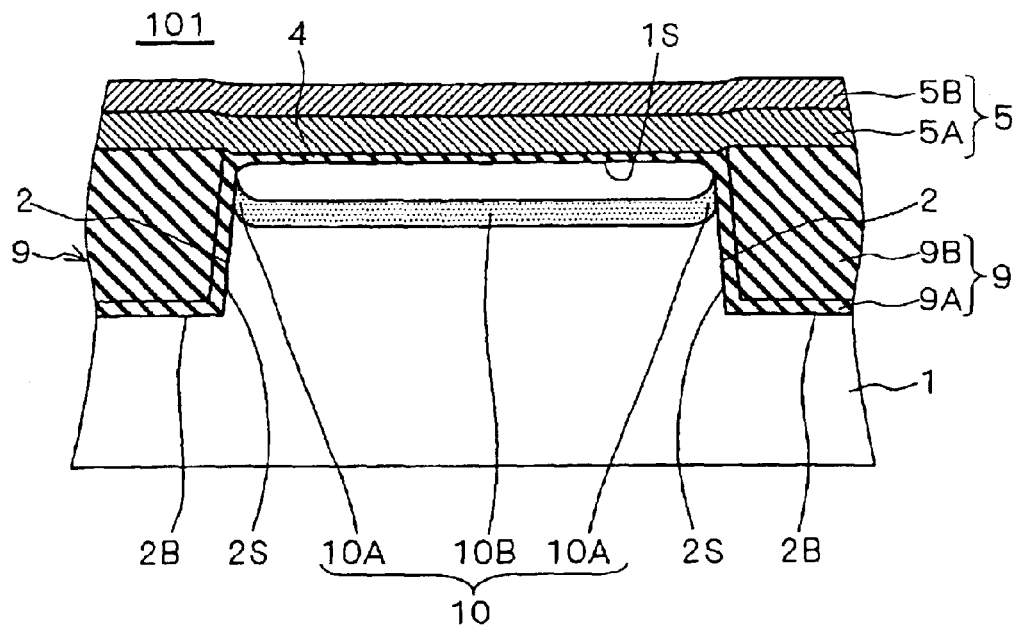
Figure 6:
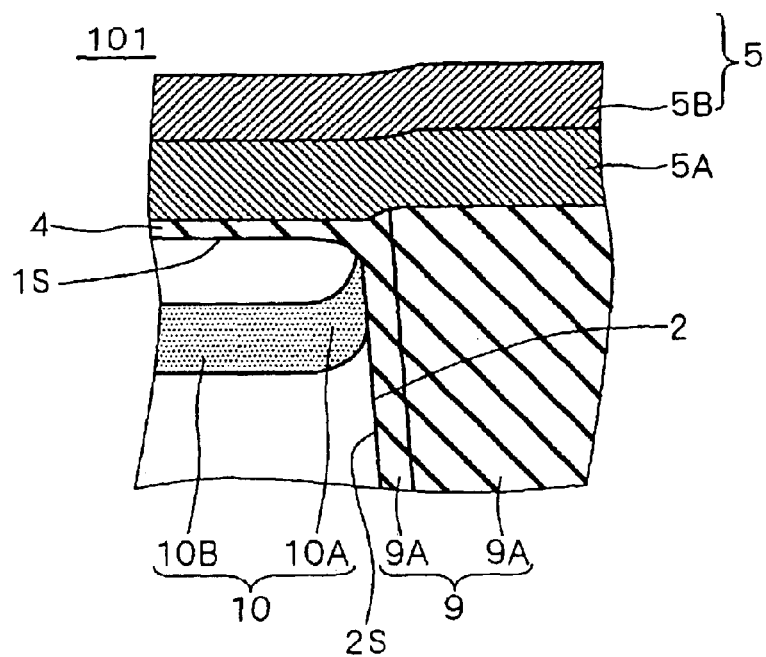
FIG. 6 is a cross section showing part of the semiconductor device in accordance with the first preferred embodiment of the present invention.
Figure 7:
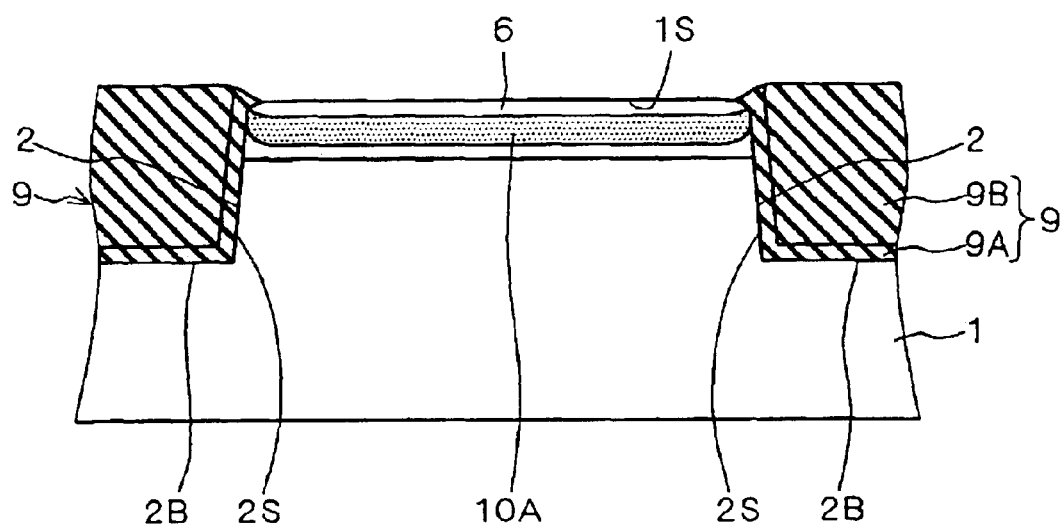
FIG. 7 is a cross section showing the semiconductor device in accordance with the first preferred embodiment of the present invention.

FIG. 1 is a schematic plan (top) view showing a semiconductor device 101 in accordance with the first preferred embodiment of the present invention. FIGS. 2 and 4 are (vertical) cross sections taken along the line A1—A1 and the line A2—A2 in FIG. 1, respectively. FIG. 3 is an enlarged cross section showing part of FIG. 2. FIGS. 5 and 7 are (vertical) cross sections taken along the line B1—B1 and the line B2—B2 in FIG. 1, respectively. FIG. 6 is an enlarged cross section showing part of FIG. 5. In FIG. 1, part of the elements shown in FIGS. 2 to 7 are omitted for simple illustration while a channel impurity layer 10 discussed later is schematically shown.

As shown in FIGS. 1 to 7, the semiconductor device 101 comprises a semiconductor substrate formed of, e.g., P-type silicon single crystal (hereinafter, referred to simply as "substrate") 1. A trench 2 is formed, extending from a main surface 1S of the substrate 1 towards the inside of the substrate 1 at a predetermined depth, and the trench 2 defines an isolation region AR2 in the main surface 1S.

The isolation region AR2 includes not only a two-dimensional region on the main surface 1S of the substrate 1 but only a three-dimensional region in a direction perpendicular to the main surface 1S, and more specifically, includes both regions in a direction of film thickness of the substrate 1 and above the main surface 1S. In this case, the substrate 1 is divided into two regions, i.e., the isolation region AR2 and an active region AR1 which is a three-dimensional region other than the isolation region AR2, and the active region AR1 is surrounded by the isolation region AR2.

Further, the distance from the main surface 1S of the substrate 1 to a bottom portion 2B of the trench 2, i.e., the depth of the trench 2 is, e.g., about 100 nm to 500 nm.

As shown in FIGS. 2 to 7, a silicon oxide film 9A is formed on an inner surface (a side surface 2S and a bottom surface) of the trench 2 along the inner surface, and a silicon oxide film 9B is so formed on the silicon oxide film 9A as to fill the trench 2. Thus, the trench 2 is filled with the silicon oxide films 9A and 9B (hereinafter, also generally referred to as "silicon oxide film (dielectric substance) 9"). The silicon oxide film 9 is a so-called trench isolation. The silicon oxide film 9 is formed up to a level equal to or higher than the level of the main surface 1S of the substrate 1 and has no shape sagging from the main surface 1S.

The semiconductor device 101 comprises an N channel-type field effect transistor (NMOSFET) in the active region AR1.

In more detail, a gate insulating film 4 extends on the main surface 1S of the substrate 1 across the substantial center of the active region AR1 (see FIG. 1). The gate insulating film 4 is formed of a silicon oxide film having a film thickness of, e.g., about 3 nm to 7 nm. As shown in FIGS. 5 and 6, edge portions of the gate insulating film 4 in the extending direction are in contact with the silicon oxide film 9 (or 9A), and the gate insulating film 4 and the silicon oxide film 9 are coupled to each other, being unitized.

A polysilicon film 5A having a film thickness of about 40 nm to 70 nm and a tungsten silicide film 5B having a film thickness of about 50 nm to 100 nm are layered on the gate insulating film 4 in this order, and the polysilicon film 5A and the tungsten silicide film 5B form a gate electrode 5. Further, as shown in FIGS. 1 and 5, the gate electrode 5 extends also on the silicon oxide film 9 across the silicon oxide film 9. Furthermore, a sidewall oxide film 41 is formed on the gate insulating film 4, being in contact with a side surface of the gate electrode 5.

Further, N-type source/drain layers 6 (the second and third impurity layers) of conductivity type opposite to that of the substrate 1 are formed in regions of the main surface 1S of the substrate 1 divided by the gate insulating film 4. In more detail, the source/drain layers 6 are each formed in part of the main surface 1S of the substrate 1 in contact with the trench 2 and are arranged with a channel region of the MOSFET below the gate electrode 5 interposed therebetween, not being in contact with each other.

More specifically, the source/drain layers 6 each consists of an N$^+$-type layer 6B and an N$^+$-type layer 6A having an impurity concentration lower than that of the N$^+$-type layer 6B. In this case, the N$^+$ type layer 6B extends in the main surface 1S of the substrate 1 from near a portion immediately below the edge portion of the gate insulating film 4 towards the opposite side of the gate insulating film 4, up to the silicon oxide film 9 or the trench 2. The N$^-$-type layers 6A are each in contact with the N$^+$-type layer 6B in the main surface 1S of the substrate 1, extending up to near a portion below an interface between the gate electrode 5 and the sidewall oxide film 41. Further, the N$^+$-type layer 6B is formed deeper from the main surface 1S of the substrate 1 than the N$^-$-type layer 6A. The N$^-$-type layer 6A is a so-called LDD (Lightly Doped Drain) layer.

Furthermore, the channel impurity layer (the first impurity layer) 10 to control a threshold voltage of the MOSFET is formed in the active region AR1. The channel impurity layer 10 is formed of a P-type layer like the substrate 1 and has an impurity concentration higher than that of the substrate 1. As shown in FIGS. 1 to 7, the whole of the channel impurity layer 10 is formed at the depth between the depth level of the bottom portion 2B of the trench 2 and that of the main surface 1S of the substrate 1. The channel impurity layer 10 includes a first portion 10A and a second portion 10B and so extends as to be opposed to the main surface 1S of the substrate 1 on the whole. Further, an edge portion or a rim portion (a first portion 10A discussed later) of the channel impurity layer 10 is in contact with the trench 2. Part of the channel impurity layer 10 and part of the source/drain layers 6 share a formation region (overlap one another) in the substrate 1.

Figure 20:
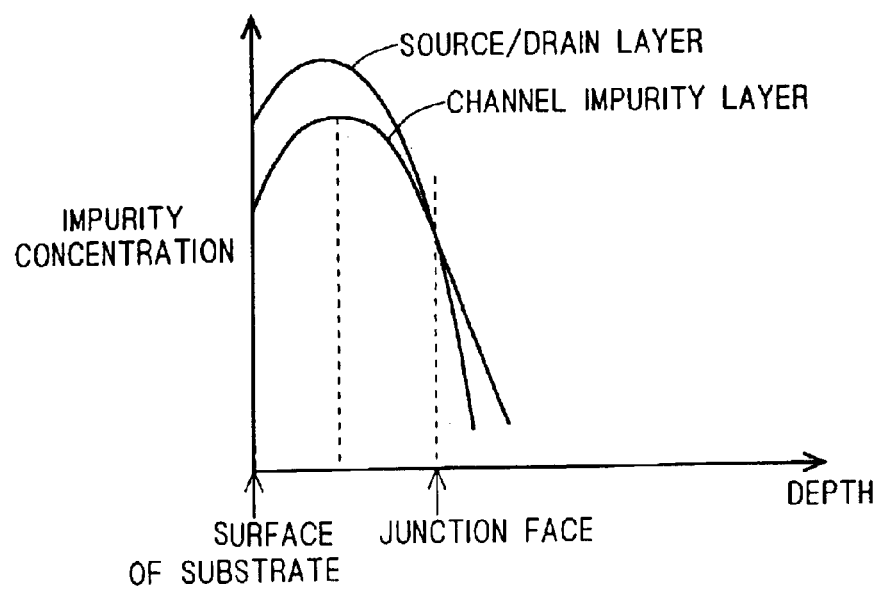
FIG. 20 is a schematic view showing an impurity concentration distribution in the semiconductor device in accordance with the first preferred embodiment of the present invention.

In detail, the first portion 10A corresponds to a portion in contact with the side surface 2S of the trench 2, along the side surface 2S in the channel impurity layer 10. In particularly, the first portion 10A is formed near an opening edge of the trench 2 or near the main surface 1S in the substrate 1, and part of the first portion 10A is formed in each of the N$^+$-type layers 6B (accordingly, in each of the source/drain layers 6), as shown in FIGS. 4 and 7. More specifically, as shown in FIG. 20 described later, both the impurity concentration distributions of the first portion 10A and the source/drain layers 6 have their peaks on the same side relative to a junction face between the substrate 1 and the source/drain layer 6.

On the other hand, the second portion 10B corresponds to a portion other than the first portion 10A or a central portion in the channel impurity layer 10. Specifically, the second portion 10B is formed continuously with (contiguously to) the first portion 10A, in a plane substantially parallel to the main surface 1S of the substrate 1.

Figure 24:
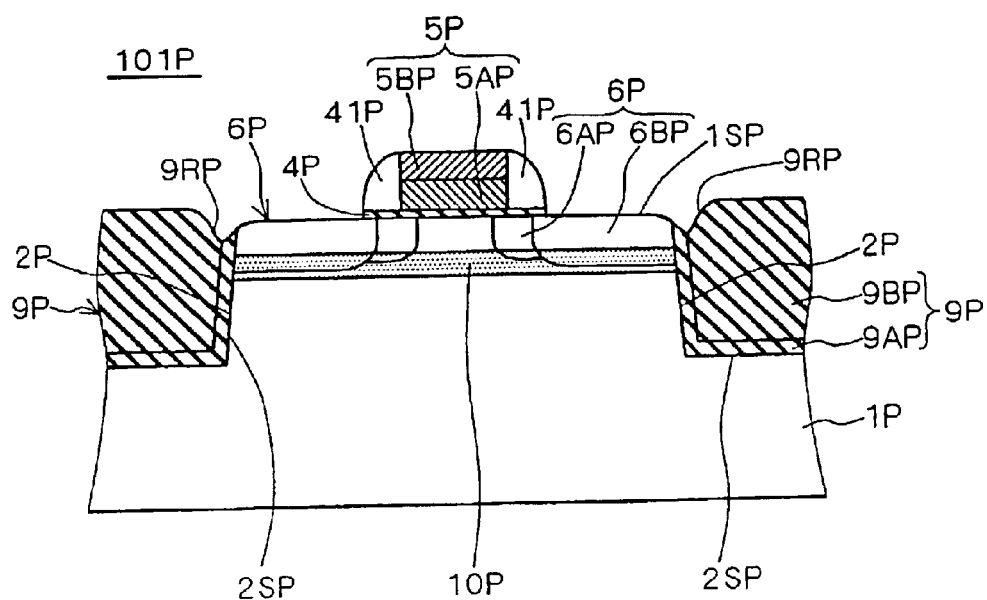
FIGS. 24 and 25 are cross sections each showing the semiconductor device in the background art.
Figure 25:
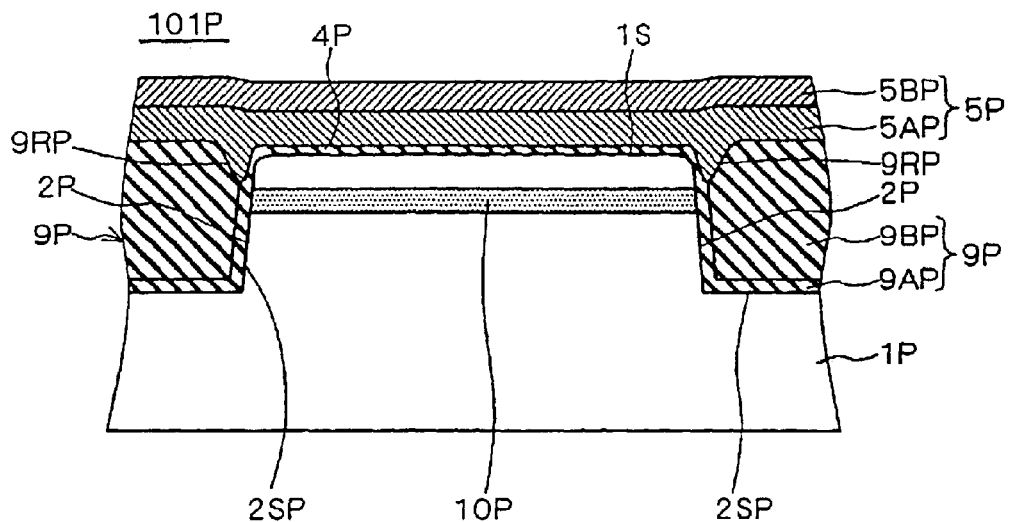
Figure 26:
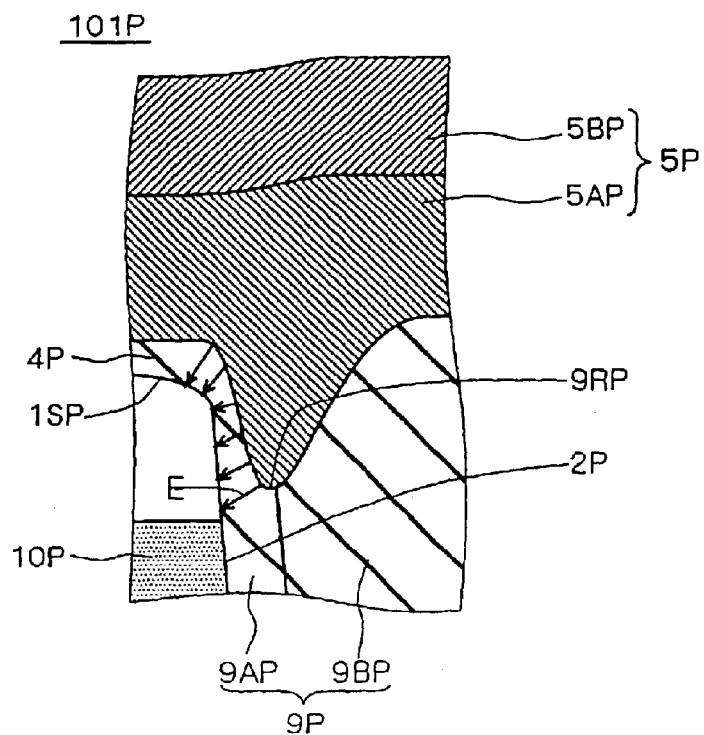
FIG. 26 is a cross section showing part of the semiconductor device in the background art.
Figure 27:
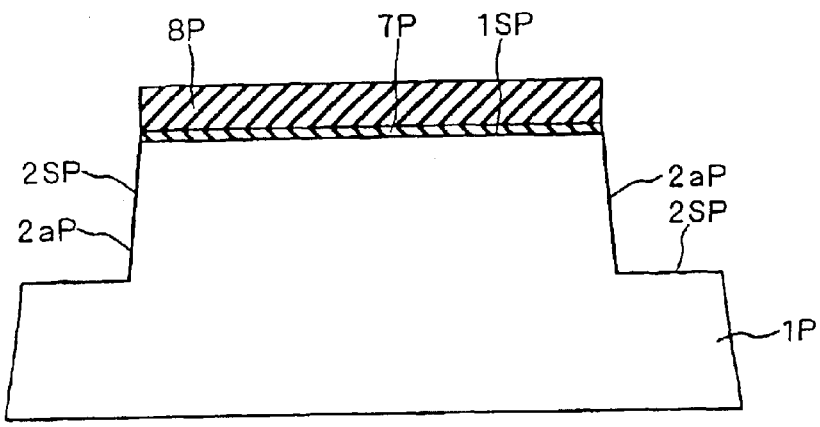
FIGS. 27 to 31 are cross sections showing a method of manufacturing the semiconductor device in the background art.
Figure 28:
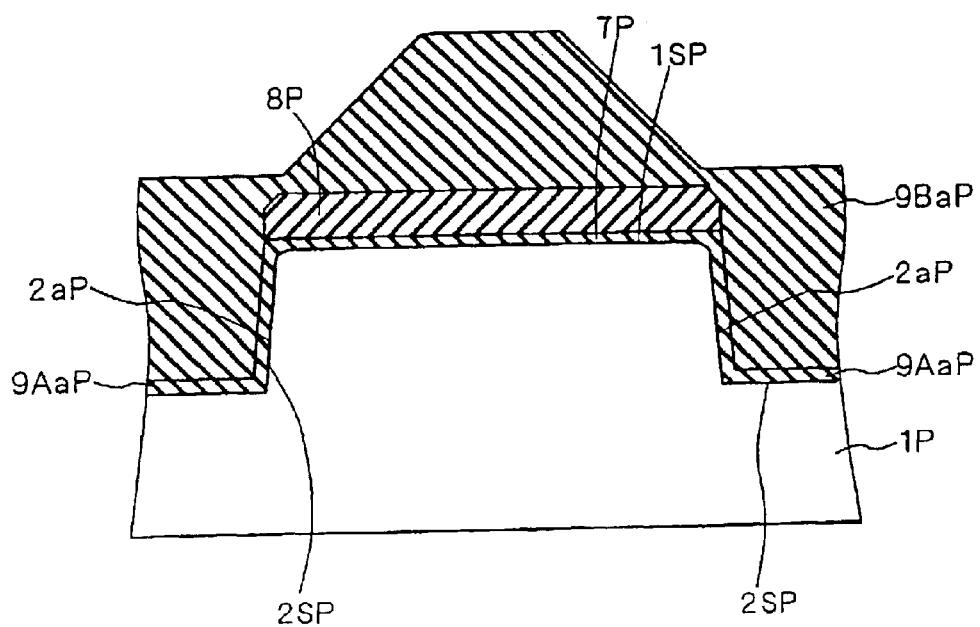
Figure 29:
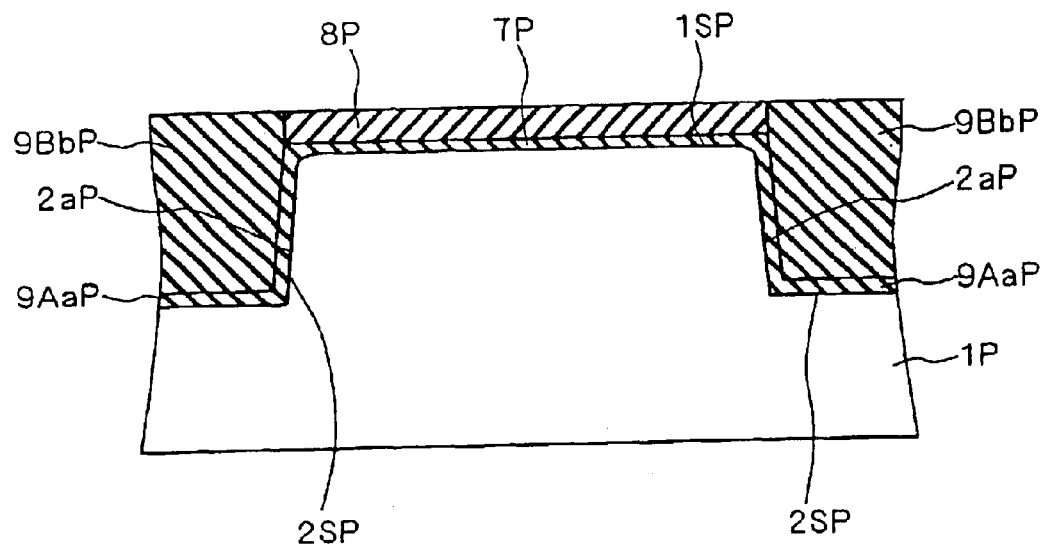
Figure 30:
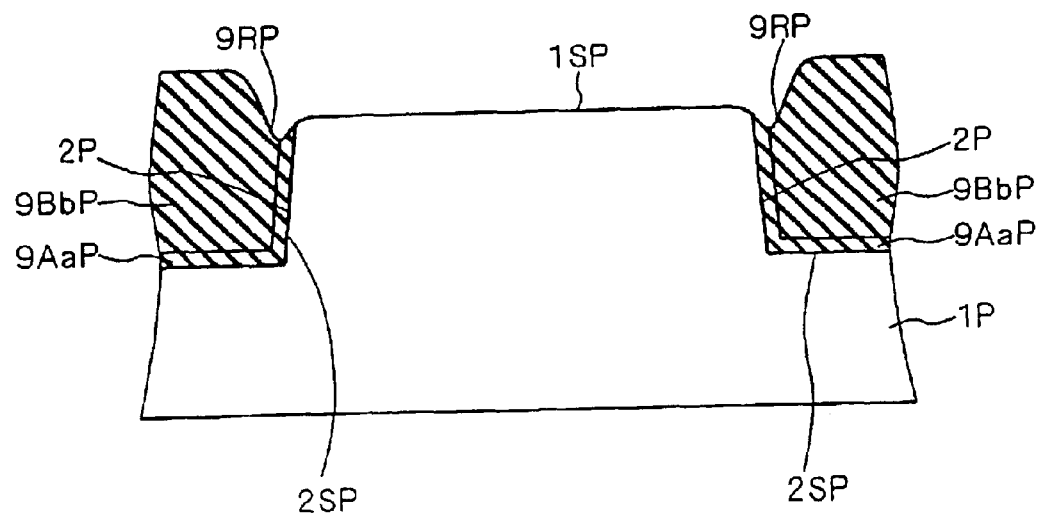
Figure 31:
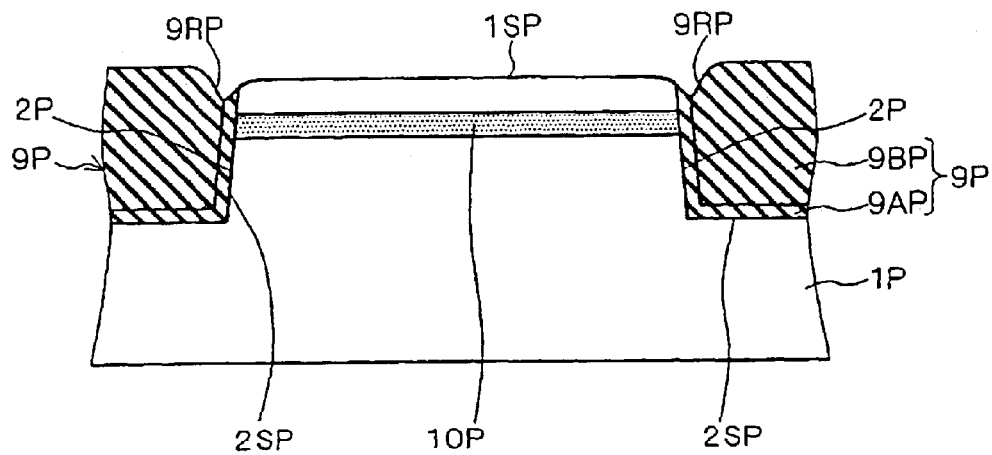
Figure 32:
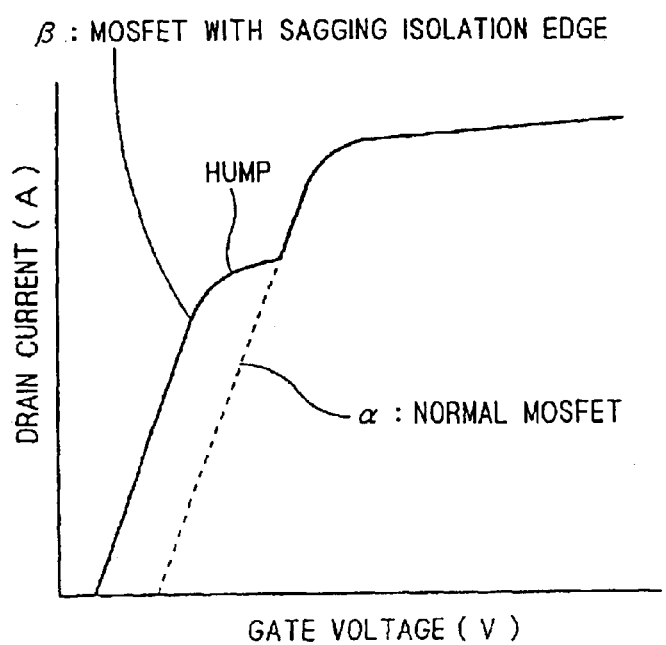
FIG. 32 is a view showing operating characteristics of the semiconductor device in the background art.

Further, herein, discussion will be made on a case where the threshold voltage of the MOSFET included in the semiconductor device 101 is the same as that in the background-art semiconductor device 101P. Therefore, the second portion 10B of the channel impurity layer 10 arranged below the channel region of the MOSFET is formed almost as deep as the background-art channel impurity layer 10P of the semiconductor device 101P (see FIGS. 24 and 25).

In this case, the first portion 10A of the channel impurity layer 10 is formed shallower than the second portion 10B (closer to the main surface 1S of the substrate 1) in the semiconductor device 101, and formed shallower than the background-art channel impurity layer 10P in the semiconductor device 101P. Conversely, the second portion 10B is formed deeper than the first portion 10A from the main surface 1S.

Further, though not shown, a channel cut impurity layer is formed near the bottom portion 2B of the trench 2 in the substrate 1 and a well impurity layer is formed deeper than the channel cut impurity layer and the channel impurity layer 10.

Next, a method of manufacturing the semiconductor device 101 will be discussed, referring to FIGS. 8 to 18 along with FIGS. 1 to 7. Further, FIGS. 8 to 16 are vertical cross sections taken along the line A1—A1 of FIG. 1, like FIG. 2. FIG. 11 is an enlarged cross section showing part of FIG. 10. FIG. 17 is a schematic view used for explaining an implantation condition in an ion implantation process discussed later.

Figure 8:
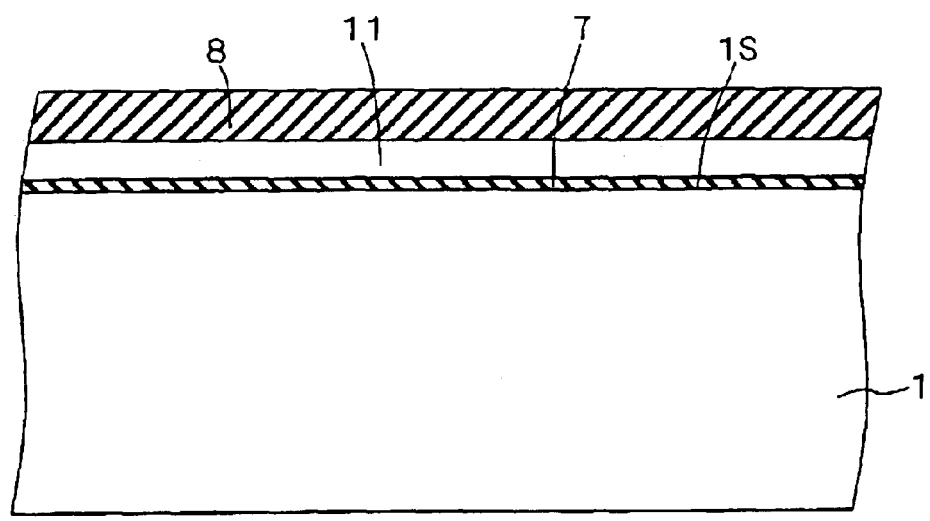
FIGS. 8 to 19 are cross sections showing a method of manufacturing the semiconductor device in accordance with the first preferred embodiment of the present invention.

First, the substrate 1 is prepared, and the whole of the main surface 1S of the substrate 1 is thermally oxidized to form a silicon oxide film (or oxide film) 7 to have a film thickness of about 5 nm to 30 nm as shown in FIG. 8. Subsequently, a silicon film (or semiconductor film) 11 (made of silicon which is the same semiconductor material as that of the substrate 1) is formed on an exposed surface of the silicon oxide film 7 to have a film thickness of about 10 nm to 50 nm. The silicon film 11 is made of non-single crystal such as polysilicon and amorphous silicon. Further, the silicon film 11 may be doped or not. Furthermore, a silicon nitride film 8 is formed on an exposed surface of the silicon film 11 to have a film thickness of about 100 nm to 300 nm.

Figure 9:
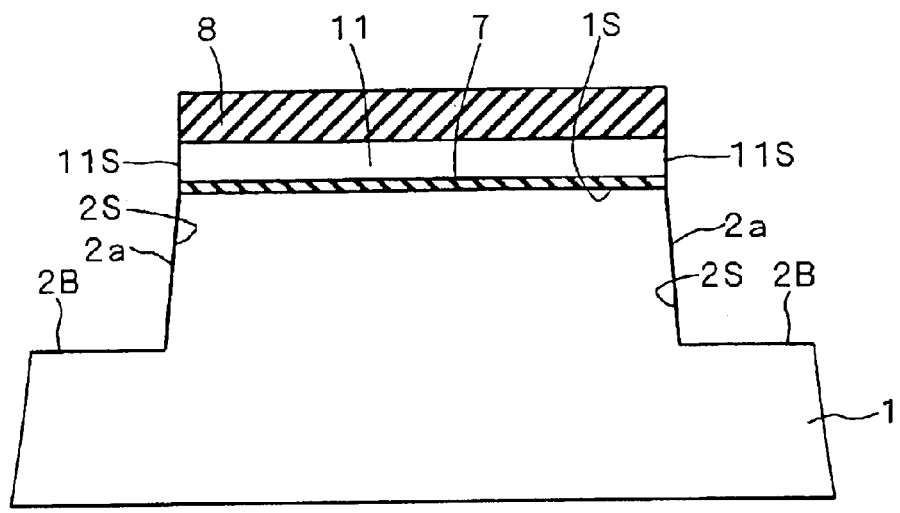

Next, a resist (not shown) to cover a region other than the region which is to be the isolation region AR2 is formed on an exposed surface of the silicon nitride film 8 by photolithography technique. Then, by anisotropic etching with the resist used as a mask, the silicon nitride film 8, the silicon film 11, the silicon oxide film 7 and the substrate 1 is partially etched in this order (up to the depth of, e.g., about 100 nm to 500 nm from the main surface 1S). With this etching, a trench 2a (including the already-discussed trench 2 shown in FIG. 2) is formed, extending from the exposed surface of the silicon nitride film 8 to the inside of the substrate 1 as shown in FIG. 9.

Figure 10:
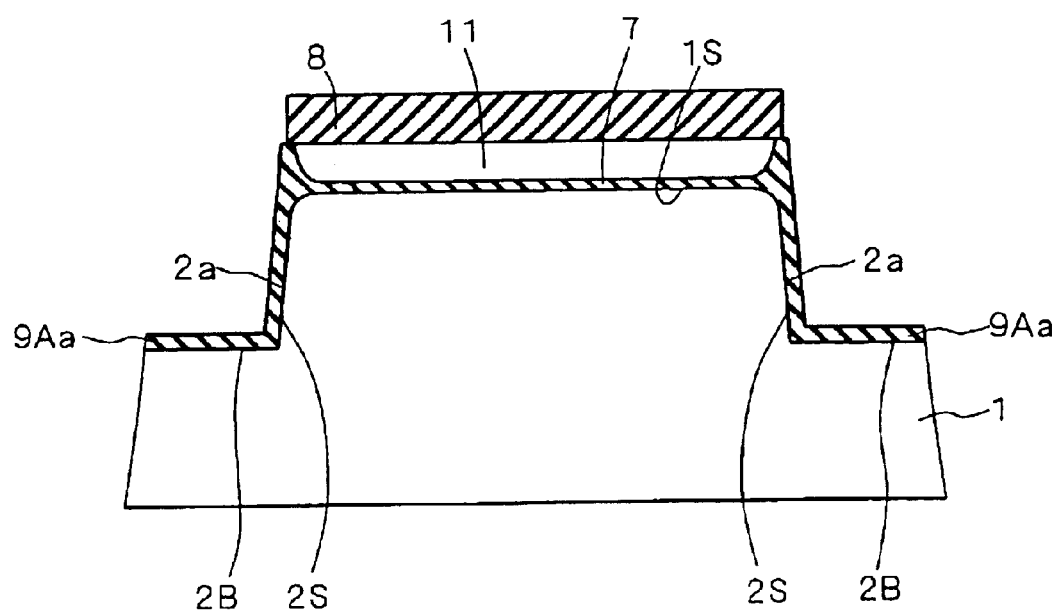
Figure 11:
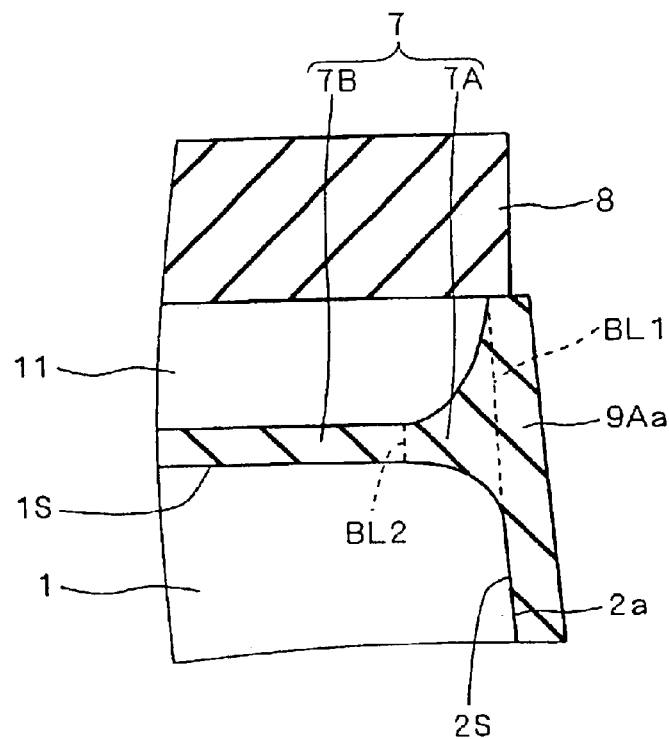

Subsequently, an exposed surface of the substrate 1 (which corresponds to the inner surface of the already-discussed trench 2) in the inner surface of the trench 2a and an exposed surface 11S of the silicon film 11 are oxidized by a thermal oxidation method, a plasma oxidation method and the like, to form a silicon oxide film 9Aa as shown in FIGS. 10 and 11. Further, the silicon oxide film 9Aa and an edge portion of the silicon oxide film 7 along the trench 2a are coupled to each other, being unitized, and FIG. 11 schematically shows a boundary between the silicon oxide films 9Aa and 7 by the broken line BL1.

At this time, as shown in FIG. 11, the edge portion of the silicon oxide film 7 along the trench 2a, which is formed on the main surface 1S of the substrate 1, changes into the shape like a so-called bird's beak and becomes thicker than its initial state. For this reason, the silicon oxide film 7 after the oxidation process includes (a) the above edge portion in the bird's beak shape or a thick portion 7A and (b) a thin portion 7B other than the thick portion 7A on the main surface 1S of the substrate 1. The film thickness of the thin portion 7B is substantially equal to the initial thickness. Further, FIG. 11 schematically shows a boundary between the thick portion 7A and the thin portion 7B by the broken line BL2.

Figure 12:
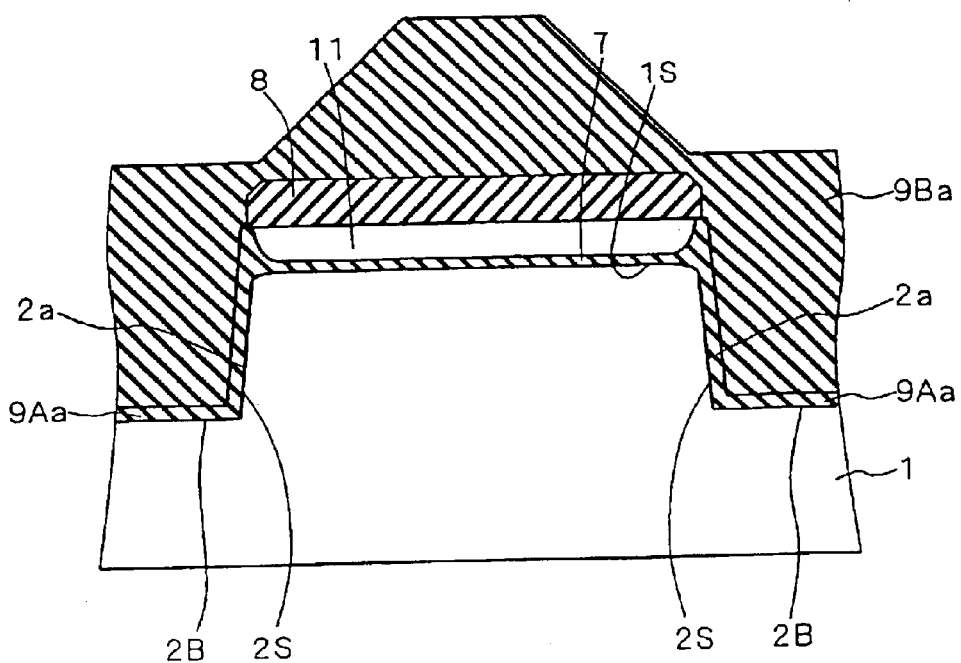

After that, as shown in FIG. 12, a silicon oxide film 9Ba is so deposited as to cover the whole surface of the substrate 1 on the side of the main surface 1S to fill the inside of the trench 2a by the HDP (High Density Plasma)-CVD (Chemical Vapor Deposition) method. The silicon oxide film 9Ba is formed to have a film thickness of, e.g., about 200 nm to 700 nm.

Further, instead of the silicon oxide film 9Ba, for example, a silicon oxynitride film, a PSG (Phospho-Silicate Glass) film, a BPSG (Boro-Phospho Silicate Glass) film, an FSG (Fluorine Doped Silicon Glass) film or the like may be used. Furthermore, the silicon oxide film 9Ba may be formed by a film formation method other than the HDP-CVD method. By a film formation method in which etching (or sputtering) and film formation are performed at the same time, such as the above HDP-CVD method, the trench 2a can be filled with the silicon oxide film 9Ba with little seam.

Figure 13:
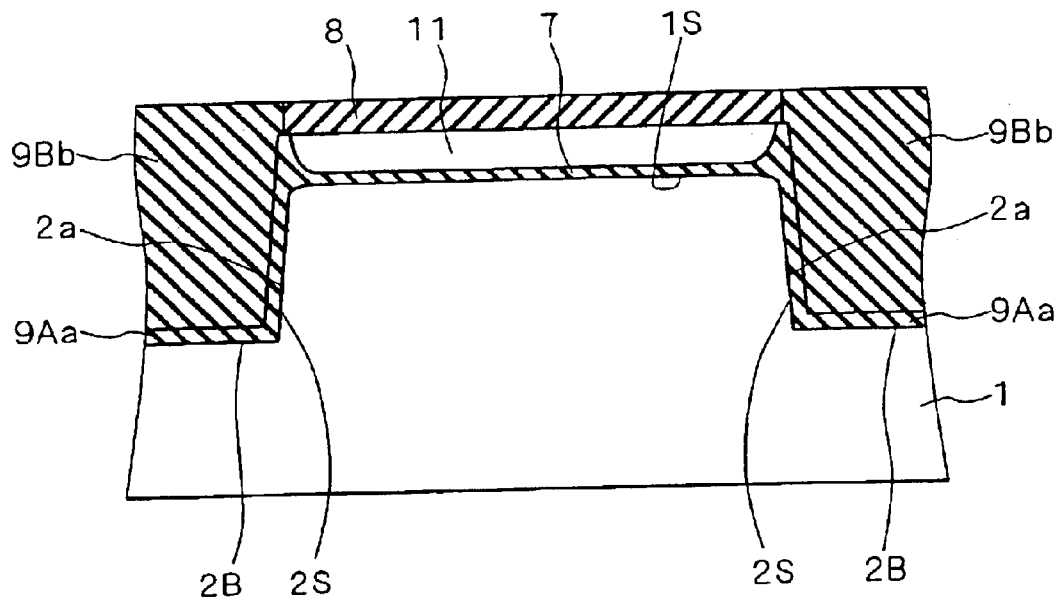

Next, the silicon oxide film 9Ba shown in FIG. 12 is partially removed by the CMP (Chemical Mechanical Polishing) method with the silicon nitride film 8 used as a stopper as shown in FIG. 13. More specifically, the silicon oxide film 9Ba is polished until the silicon nitride film 8 is exposed, to leave the portion of the silicon oxide film 9Ba existing in the trench 2a as the silicon oxide film 9Bb.

Figure 14:
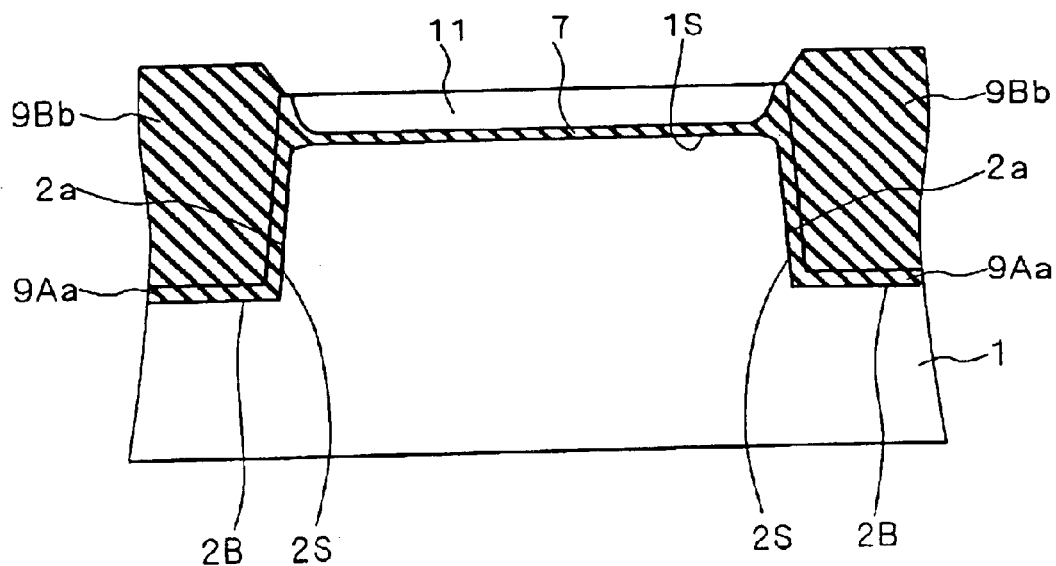
Figure 15:
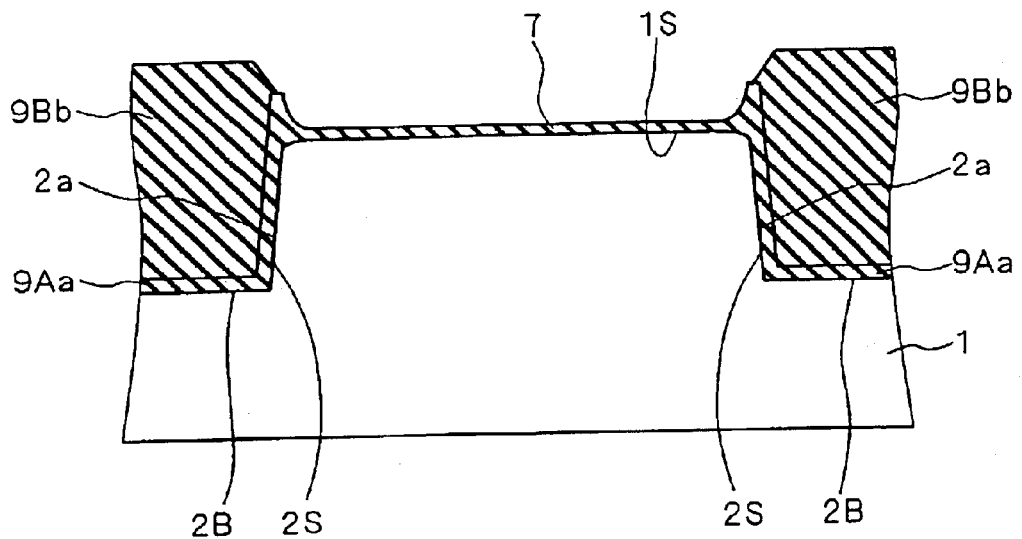

After that, the silicon nitride film 8 is removed by wet etching (isotropic etching) with thermal phosphoric acid (see FIG. 14) and the silicon film 11 is removed by wet etching (isotropic etching) with mixture of ammonia and hydrogen peroxide (see FIG. 15).

Next, boron ion is implanted through the exposed silicon oxide film 7 at an accelerating energy of about 200 keV to 1 MeV, to form the well impurity layer (not shown). Further, boron ion is implanted at an accelerating energy of about 100 keV to 300 keV, to form the channel cut impurity layer (not shown) in the substrate 1 near the bottom portion 2B of the trench 2a (or trench 2).

Figure 16:
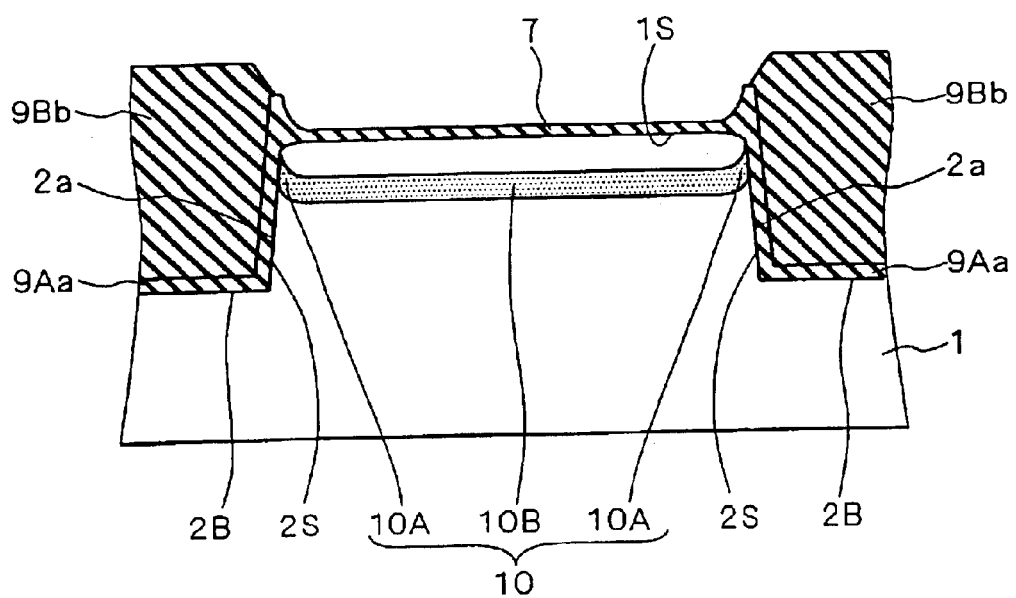
Figure 17:
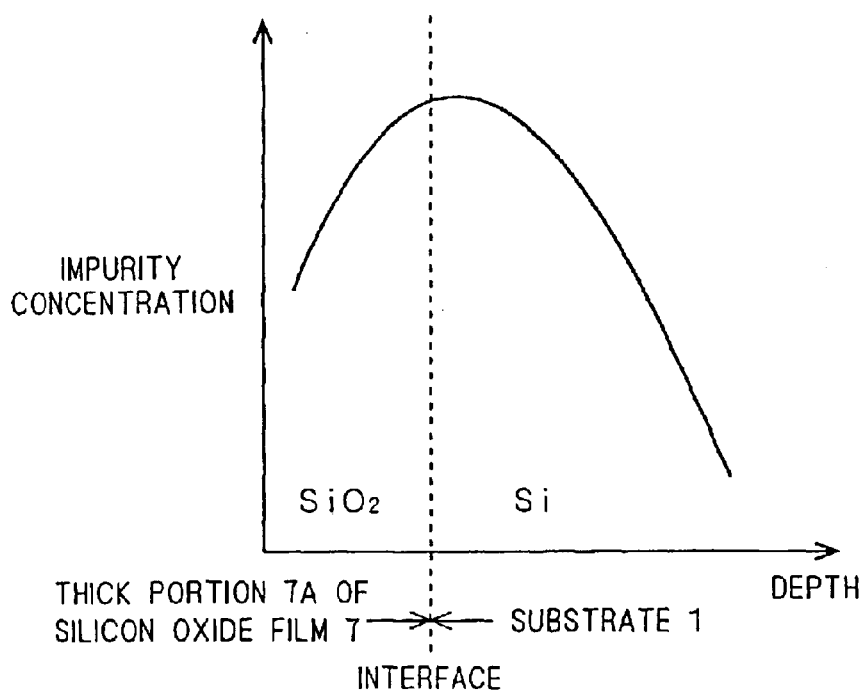

Furthermore, boron ion is implanted into the main surface 1S of the substrate 1 at an accelerating energy of about 10 keV to 100 keV, to form the channel impurity layer 10 as shown in FIG. 16. At this time, the impurity (boron) can be implanted shallower through the thick portion 7A of the silicon oxide film 7 than through the thin portion 7B. In particular, the implantation condition is set so that the concentration distribution of the implanted impurity in the direction of depth has its peak near an interface (which corresponds to part of the main surface 1S) between the substrate 1 and the thick portion 7A of the silicon oxide film 7, as shown in the schematic view of FIG. 17. After that, an RTA (Rapid Thermal Annealing) is performed on the substrate 1 after being ion-implanted. The rapid thermal annealing is performed in the temperature range, e.g., from about 700° C. to 1100° C. for about thirty to sixty seconds.

Figure 18:
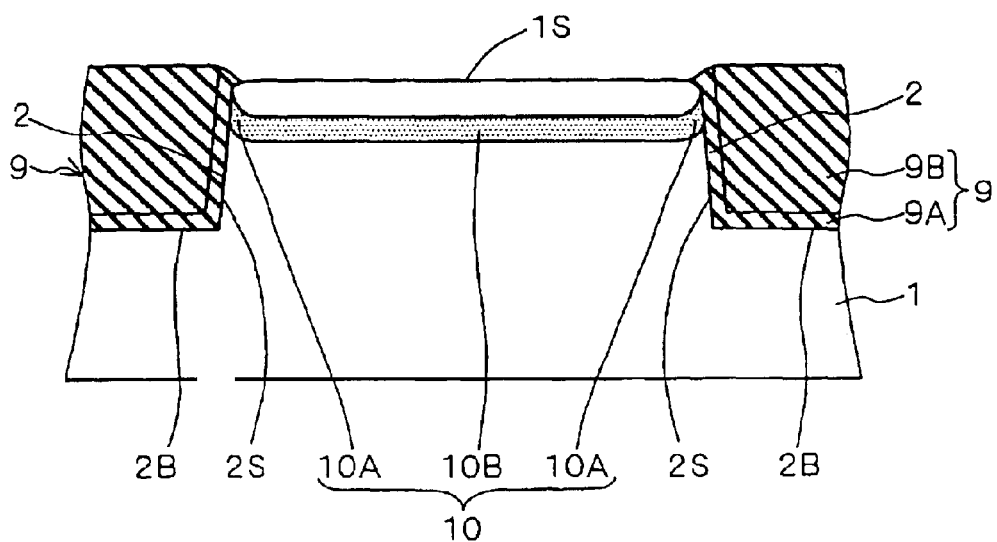

Subsequently, the silicon oxide film 7 is wet-etched with hydrofluoric acid to expose the main surface 1S of the substrate 1 (see FIG. 18). At this time, the silicon oxide films 9Aa and 9Bb are also partially removed, to leave the trench 2 in the trench 2a which is part of the substrate 1 and leave the silicon oxide film 9 consisting of the earlier-discussed silicon oxide films 9A and 9B in the trench 2.

After that, the exposed main surface 1S of the substrate 1 is thermally oxidized to form a silicon oxide film (which is to become the gate insulating film 4 later) having a film thickness of about 3 nm to 7 nm. Further, edge portions of the silicon oxide film is coupled to the silicon oxide film 9 (or 9A), being unitized. Subsequently, a polysilicon film having a film thickness of about 40 nm to 70 nm and a tungsten silicide film having a film thickness of about 50 nm to 100 nm are sequentially deposited by the CVD method. Then, the polysilicon film and the tungsten silicide film are patterned by photolithography technique and anisotropic etching, to form the gate electrode 5 (see FIG. 2).

Next, phosphorus ion is implanted by ion implantation at an accelerating energy of about 20 keV to 50 keV. Subsequently, the sidewall oxide film 41 (see FIG. 2) is formed on the side surface of the gate electrode 5. Further, an arsenic ion is implanted by ion implantation at an accelerating energy of about 10 keV to 50 keV. After that, through a heat treatment, the N$^-$-type layer 6A including only phosphorus and the N$^+$-type layer 6B including the arsenic are formed. In other words, the source/drain layers 6 are formed. Through the above process steps, the semiconductor device 101 shown in FIGS. 1 to 7 is completed.

The semiconductor device 101 and the method of manufacturing the semiconductor device 101 produce the following effects.

Since the thermal oxidation method and the like are used to form the silicon oxide film 9Aa (or 9A) as discussed above, the thick portion 7A (see FIG. 11) can be formed in the silicon oxide film 7. For this reason, unlike the background-art method of manufacturing the semiconductor device 101P, it is possible to avoid formation of the sag 9RP (see FIG. 24) in the silicon oxide films 9Bb and 9Aa or the silicon oxide films 9A and 9B because of the presence of the thick portion 7A even when the silicon oxide film 7 is wet-etched with hydrofluoric acid as shown in FIGS. 16 and 18. Therefore, it becomes possible to suppress formation of the parasitic MOSFET (parasitic element) due to the presence of the sag 9RP. This can suppress the hump and the inverse-narrow channel effect in the MOSFET of the semiconductor device 101 to reduce the leak current. As a result, the MOSFET, and further the semiconductor device 101, can operate with the desired (designed) characteristics.

Anyway, even when no sag 9RP exists, the electric field from the wires (including the gate electrode 5) formed in the isolation region AR2 or on the silicon oxide film 9 affects the potential at the edge of the active region through the silicon oxide film 9 or the side surface 2S of the trench 2 and may form the parasitic MOSFET. The semiconductor device 101, however, can reduce the effect of this parasitic MOSFET.

Specifically, in the semiconductor device 101, the first portion 10A of the channel impurity layer 10 is formed shallower than the second portion 10B (accordingly, than the background-art channel impurity layer 10P). The first portion 10A, particularly, is formed along the side surface 2S of the trench 2. Therefore, the impurity concentration near the opening edge of the trench 2 in the substrate 1 is higher than that in the background-art substrate 1P by the first portion 10A. Accordingly, the semiconductor device 101 makes it hard for the parasitic MOSFET to turn on as compared with the background-art 101P in which the whole of the channel impurity layer 10P is formed at the same level as the second portion 10B. In other words, it is possible to suppress formation of the parasitic MOSFET whose threshold voltage is low. Also in this point, the semiconductor device 101 can operate with the desired characteristics, with the hump and the inverse-narrow channel effect reduced.

In the semiconductor device 101, particularly, the first portion 10A of the channel impurity layer 10 is formed near the opening edge of the trench 2 or near the main surface 1S of the substrate 1. In this case, considering that the above electric field from the wires becomes stronger as it is closer to the wires and the like, in other words, closer to the opening edge of the trench, with the first portion 10A of the channel impurity layer 10 provided in a portion where the above electric field is stronger, the above effect can be reliably produced.

As discussed above, since boron is implanted through the silicon oxide film 7 having the thick portion 7A in order to form the channel impurity layer 10, the impurity can be implanted shallower through the thick portion 7A than through the thin portion 7B. For this reason, the first portion 10A of the channel impurity layer 10 can be formed closer to the main surface 1S of the substrate 1 near the trench 2 or near the edge of the active region than the second portion 10B. In other words, it is not necessary to implant the impurity in different steps with the resists formed in order to change the implantation depth.

Moreover, in order to form the channel impurity layer 10, the implantation condition is set so that the concentration distribution of the impurity in the direction of depth has its peak near the interface between the substrate 1 and the thick portion 7A of the silicon oxide film 7. Therefore, the first portion 10A of the channel impurity layer 10 can be reliably formed near the opening edge of the trench 2.

Further, in the above manufacturing method, the RTA is performed after the ion implantation to form the channel impurity layer 10. This can anneal out the point defect in the crystal caused by ion implantation. Furthermore, it is possible to suppress TED (Transient Enhanced Diffusion) in the later heat treatment and the impurity concentration of the boron to form the channel impurity layer 10 can have the desired distribution. Therefore, it is possible to reliably manufacture the semiconductor device 101 capable of exerting the above effect which is produced by the channel impurity layer 10.

Furthermore, in the above manufacturing method, the silicon film 11 is removed by wet etching (isotropic etching) with mixture of ammonia and hydrogen peroxide as shown in FIGS. 14 and 15. In other words, without dry etching (anisotropic etching), it is possible to avoid the plasma damage at the dry etching.

Figure 19:
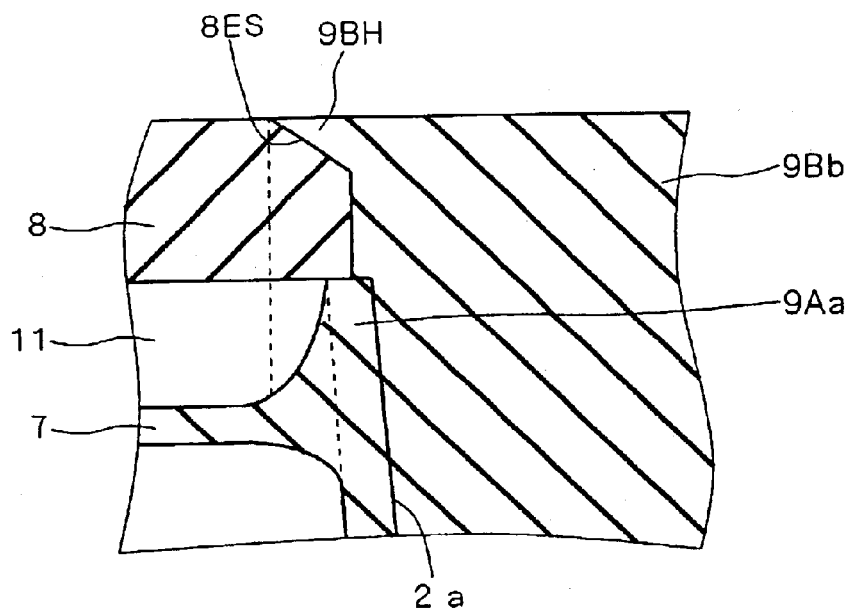

Further, by wet etching, the whole of the silicon film 11 can be easily removed with the etching remainder reduced. This effect will be discussed, referring to the enlarged view showing part of the semiconductor device 101 in FIG. 19.

Since the above HDP-CVD method is a film formation method in which etching and film formation are performed at the same time, when the silicon oxide film 9Ba is formed by the HDP-CVD method, the edge portion of the silicon nitride film 8 is etched (or sputtered), to form a slope 8ES (see FIG. 19) at the edge portion. After that, when deposition of the silicon oxide film 9Ba and the CMP process are performed, an overhang portion 9BH in contact with the slope 8ES is sometimes formed in the silicon oxide film 9Bb after the CMP process. Further, the size of the overhang portion 9BH depends on the degree to which the silicon nitride film 8 serving as the stopper film at the CMP is polished. If the silicon oxide film 9Bb has the overhang portion 9BH, when the silicon film 11 is removed by dry etching, the etching remainder is left below the overhang portion 9BH. In contrast to this, since the silicon film 11 is removed by wet etching in the method of manufacturing the semiconductor device 101, the whole of the silicon film 11 can be easily and reliably removed, regardless of whether the overhang portion 9BH exists or not.

Thus, in the above manufacturing method, the semiconductor device 101 capable of operating with the desired characteristics can be manufactured at good yield.

Figure 21:
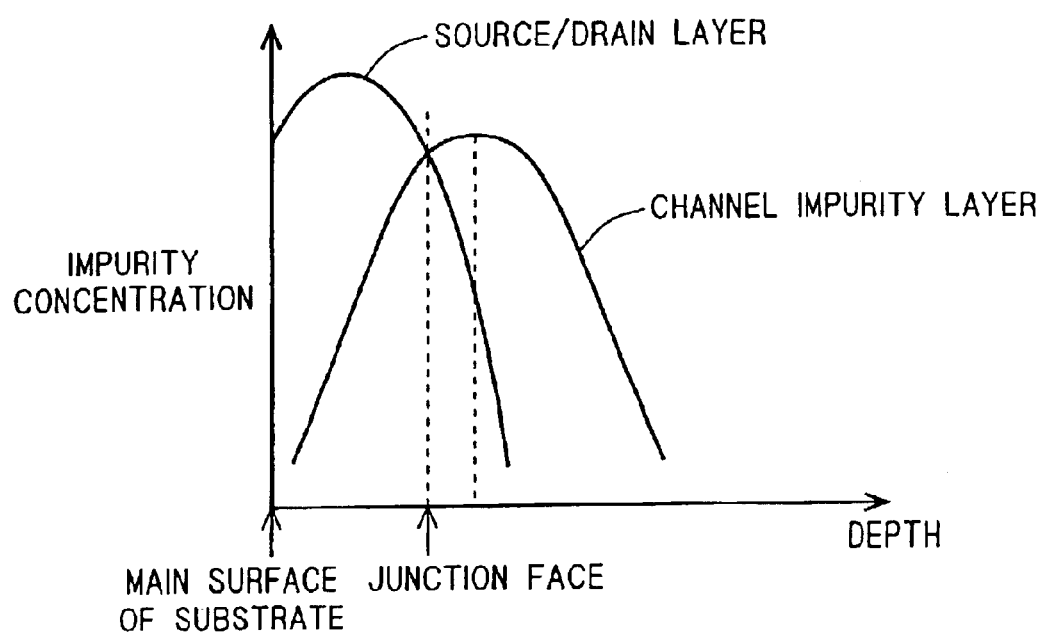
FIG. 21 is a schematic view showing an impurity concentration distribution in the semiconductor device in the background art.

Further, the semiconductor device 101 can operate faster than the background-art semiconductor device 101P. This effect will be discussed, referring to FIGS. 20 and 21. FIGS. 20 and 21 are schematic views showing the concentration distributions of the N-type source/drain layer (or N$^+$-type layer) and the P-type channel impurity layer near the edge of the active region or near the trench 2, and FIG. 20 shows that of the semiconductor device 101 while FIG. 21 shows that of the background-art semiconductor device 101P.

Since the first portion 10A of the channel impurity layer 10 is formed closer to the main surface 1S of the substrate 1 than the second portion 10B (and the background-art channel impurity layer 10P) in the semiconductor device 101 as discussed above, the first portion 10A is provided in the source/drain layer 6 (in detail, N$^+$-type layer 6B). More specifically, as shown in FIG. 20, both the impurity concentration distributions of the first portion 10A of the channel impurity layer 10 and the source/drain layers 6 have their peaks on the same side relative to a junction face between the substrate 1 and the source/drain layer 6 (an intersection of the distribution curves of both the layers). For this reason, as shown in FIG. 20, the first portion 10A of the channel impurity layer 10 largely overlaps the source/drain layer 6 at the edge of the active region. In other words, both the high-concentration regions or peak concentration regions of the source/drain layer 6 and the first portion 10A of the channel impurity layer 10 largely overlaps each other. In contrast to this, as shown in FIG. 21, the channel impurity layer 10P and the source/drain layer 6P in the background art have small overlap portion due to the difference of formation depth.

In this case, considering that the impurities of opposite conductivity types offset doping, in the semiconductor device 101 of FIG. 20, the impurity concentrations on both sides of the above junction face are lower than those in the background-art semiconductor device 101P of FIG. 21. For this reason, at the edge of the active region, the depletion layer is more likely to be widened in the direction of depth of the substrate 1 and the junction capacitance is smaller in the semiconductor device 101. Therefore, in the whole of the active region, the junction capacitance is smaller in the semiconductor device 101 and as a result, the semiconductor device 101 can operate faster. Further, higher-speed operation due to reduction in junction capacitance is an effect produced by providing part of the first portion 10A of the channel impurity layer 10 in the source/drain layer 6, which does not depend on the position where the first portion 10A of the channel impurity layer 10 is formed in the substrate 1.

<The First Variation of The First Preferred Embodiment>

Though discussion has been made on the case where the substrate 1, the silicon oxide film 7, the semiconductor film 11 and the like include silicon, the above discussion applies to a case where these elements include semiconductor materials other than silicon.

Further, though discussion has been made above on the case where the semiconductor device 101 is an NMOSFET, a P channel-type MOSFET (PMOSFET) can be provided as the semiconductor device 101, with the conductivity types of the substrate 1 and respective layers (films) inverted. Furthermore, by combining the NMOSFET and the PMOSFET, a CMOSFET can be provided as the semiconductor device 101.

<The Second Variation of The First Preferred Embodiment>

The above discussion applies to a case where the gate insulating film 4 is not a silicon oxide film, i.e., where the semiconductor device 101 comprises an FET of general MIS (Metal-Insulator-Semiconductor) structure.

Further, the gate electrode 5 may be of other layered structure such as combination of a metal film and a polysilicon film, or may be formed of polysilicon silicide film or only metal film.

<The Second Preferred Embodiment>

Figure 22:
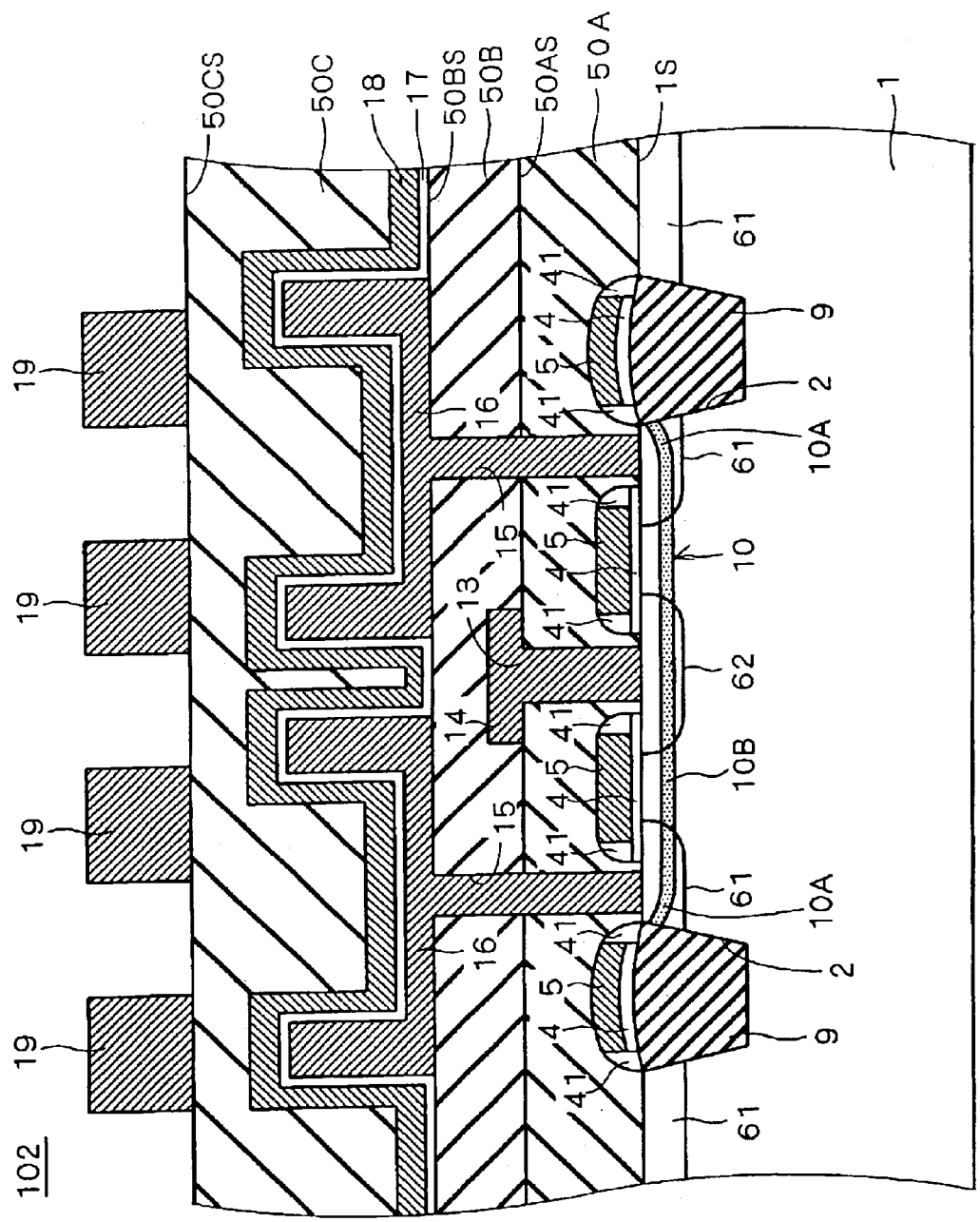
FIG. 22 is a cross section showing the semiconductor device in accordance with a second preferred embodiment of the present invention.
Figure 23:
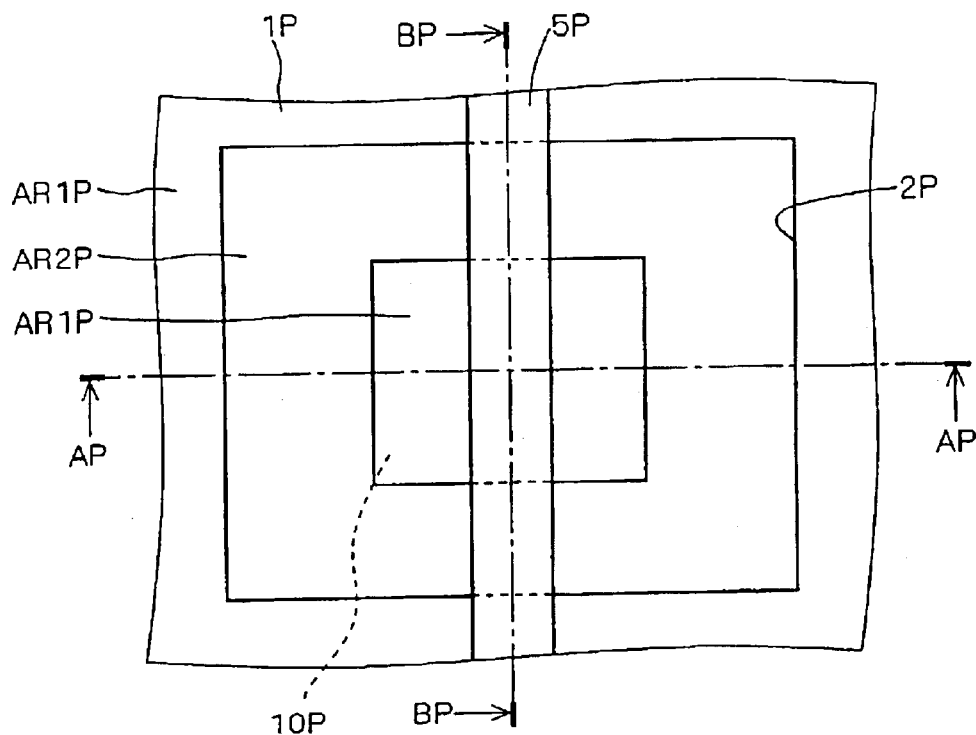
FIG. 23 is a schematic plan view showing a semiconductor device in the background art.

Next, a DRAM (Dynamic Random Access Memory) which is an appliance of the already-discussed semiconductor device 101 will be discussed as a semiconductor device 102 in accordance with the second preferred embodiment. FIG. 22 is a (vertical) cross section showing the semiconductor device 102. Further, elements identical to the already-discussed elements are given the same reference signs, and description thereof will be omitted.

As shown in FIG. 22, the semiconductor device 102 comprises the substrate 1 in which the trench 2 is formed and the silicon oxide film 9 which serves as a trench isolation is buried in the trench 2. Further, not shown in detail in FIG. 22, the silicon oxide film 9 consists of the silicon oxide films 9A and 9B (see FIG. 2).

Then, two MOSFETs are formed in the active region AR1 (see FIG. 1). In more detail, two gate insulating films 4 are formed at a predetermined distance on the main surface 1S of the substrate 1, and the gate electrode 5 and the sidewall oxide film 41 are formed on each of the gate insulating films 4. Further, the gate electrode 5 consists of the already-discussed polysilicon film 5A and tungsten silicide film 5B (see FIG. 2). Furthermore, though the gate insulating film 4, the gate electrode 5 and the sidewall oxide film 41 are formed also on the silicon oxide film 9 in FIG. 22, these constituent elements (hereinafter, collectively referred to also as "gate elements 4, 5 and 41") are formed in other active region not shown in FIG. 22 and extend towards the direction perpendicular to the paper.

Further, source/drain layers (the second and third impurity layers) 61 and 62 are formed in the main surface 1S of the substrate 1. Each of the source/drain layers 61 and 62 corresponds to the already-discussed source/drain layer 6 (see FIG. 2). Not shown in detail in FIG. 22, each of the source/drain layers 61 and 62 consists of the $N^-$-type layer 6A and the $N^+$-type layer 6B. Furthermore, the source/drain layer 62 is formed across the two MOSFETs. Specifically, the source/drain layer 62 is a unit of the respective source/drain layers 6 of the MOSFETs.

Further, like the already-discussed semiconductor device 101, the channel impurity layer 10 is formed in the active region AR1 (see FIG. 1), being opposed to the whole of the main surface 1 of the substrate 1. Specifically, the first portion 10A of the channel impurity layer 10 is in contact with the side surface 2S of the trench 2 (see FIG. 2 and the like) in the substrate 1, and formed along the side surface 2S near the opening edge of the trench 2 or near the main surface 1S. Moreover, the first portion 10A is provided in the $N^+$-type layer 6B, i.e., the source/drain layer 6. The second portion 10B of the channel impurity layer 10 is formed deeper than the first portion 10A.

The above structure can be formed by the manufacturing method discussed in the first preferred embodiment.

Further, an interlayer insulating film 50A is formed on the main surface 1S of the substrate 1, covering the gate elements 4, 5 and 41, and a contact hole 13 is so formed as to penetrate from a surface 50AS of the interlayer insulating film 50A to the source/drain layer 62. A bit line 14 connected to the source/drain layer 62 through the contact hole 13 is formed on the surface 50AS of the interlayer insulating film 50A.

Further, an interlayer insulating film 50B is formed on the surface 50AS of the interlayer insulating film 50A, covering the bit line 14, and a contact hole 15 is so formed as to penetrate from a surface 50BS of the interlayer insulating film 50B to the source/drain layer 61. A storage node 16 connected to the source/drain layer 61 through the contact hole 15 is formed on the surface 50BS of the interlayer insulating film 50B.

Then, a capacitor insulating film 17 is formed along projections and depressions on the surface 50BS of the interlayer insulating film 50B, covering the storage node 16 and the surface 50BS of the interlayer insulating film 50B.

Further, a cell plate electrode 18 is formed on the capacitor insulating film 17 along the capacitor insulating film 17.

An interlayer insulating film 50C is formed, entirely covering the cell plate electrode 18, and a plurality of wires 19 are formed on a surface 50CS of the interlayer insulating film 50C. These wire layers 19 are connected to the gate electrode 5 and the like at a portion not shown in FIG. 22.

The semiconductor device 102 can produce the same effect as the semiconductor device 101 produces. In this case, with the leak current of the MOSFET reduced, it is possible to suppress loss of electric charges accumulated in the storage node 16 (i.e., a capacitor of the DRAM).

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
    (a) preparing a substrate including a predetermined semiconductor material and having a predetermined conductivity type;
    (b) forming an oxide film including an oxide of said predetermined semiconductor material on said substrate to have a predetermined film thickness;
    (c) forming a semiconductor film including said predetermined semiconductor material on said oxide film;
    (d) partially etching said semiconductor film, said oxide film and said substrate in this order, to form a trench which extends from said semiconductor film towards the inside of said substrate;
    (e) oxidizing surfaces of said substrate and said semiconductor film which are exposed in said trench to make an edge portion of said oxide film along said trench thicker than said predetermined film thickness; and
    (f) implanting an impurity of the same conductivity type as said predetermined conductivity type into said substrate through said oxide film after said step (e), thereby forming an impurity layer,
    wherein a first portion of the impurity layer adjacent to said trench is formed shallower than a second portion of the impurity layer.

2. The method of manufacturing a semiconductor device according to claim 1, wherein
    said impurity implanted in said step (f) in said first portion has a distribution in a direction of depth of said substrate with its peak near an interface between said edge portion which becomes thicker in said step (e) and said substrate.

3. The method of manufacturing a semiconductor device according to claim 1, further comprising the step of:
    (g) performing a rapid thermal annealing on said substrate after said step (f).

4. The method of manufacturing a semiconductor device according to claim 1, further comprising the step of:
    (g) removing said semiconductor film by isotropic etching.

5. The method of manufacturing a semiconductor device according to claim 1, wherein said impurity layer includes a channel impurity layer.

6. A method of manufacturing a semiconductor device comprising the steps of:
    (a) preparing a substrate including a predetermined semiconductor material and having a predetermined conductivity type;

(b) forming an oxide film including an oxide of said predetermined semiconductor material on said substrate to have a predetermined film thickness;

(c) forming a semiconductor film including said predetermined semiconductor material on said oxide film;

(d) partially etching said semiconductor film, said oxide film and said substrate in this order, to form a trench which extends from said semiconductor film towards the inside of said substrate;

(e) oxidizing surfaces of said substrate and said semiconductor film which are exposed in said trench to make an edge portion of said oxide film along said trench thicker than said predetermined film thickness; and (f) implanting an impurity of the same conductivity type as said predetermined conductivity type into said substrate through said oxide film after said step (e), wherein said impurity implanted in said step (f) has a distribution in a direction of depth of said substrate with its peak near an interface between said edge portion which becomes thicker in said step (e) and said substrate.

7. The method of manufacturing a semiconductor device according to claim 6, further comprising the step of:

(g) performing a rapid thermal annealing on said substrate after said step (f).

8. The method of manufacturing a semiconductor device according to claim 6, further comprising the step of:

(h) removing said semiconductor film by isotropic etching.

* * * * *